US012660186B2

(12) United States Patent (10) Patent No.: US 12,660,186 B2
Jang et al. (45) Date of Patent: Jun. 16, 2026

(54) SEMICONDUCTOR DEVICE AND MANUFACTURING METHOD OF THE SEMICONDUCTOR DEVICE

(71) Applicant: SK hynix Inc., Icheon-si (KR)

(72) Inventors: Jung Shik Jang, Icheon-si (KR); In Su Park, Icheon-si (KR); Won Geun Choi, Icheon-si (KR); Jung Dal Choi, Icheon-si (KR); Rho Gyu Kwak, Icheon-si (KR); Seok Min Choi, Icheon-si (KR)

(73) Assignee: SK hynix Inc., Icheon-si (JP)

( * ) Notice: Subject to any disclaimer, the term of this patent is extended or adjusted under 35 U.S.C. 154(b) by 607 days.

(21) Appl. No.: 18/323,999

(22) Filed: May 25, 2023

(65) Prior Publication Data

US 2024/0188295 A1 Jun. 6, 2024

(30) Foreign Application Priority Data

Dec. 2, 2022 (KR) ........................ 10-2022-0166411

(51) Int. Cl.
| | |
|---|---|
| *H10B 43/27* | (2023.01) |
| *G11C 16/04* | (2006.01) |
| *H10B 41/10* | (2023.01) |
| *H10B 41/27* | (2023.01) |
| *H10B 41/30* | (2023.01) |
| *H10B 43/10* | (2023.01) |
| *H10B 43/30* | (2023.01) |
| *H10W 20/41* | (2026.01) |

(52) U.S. Cl.
CPC ......... *H10B 43/27* (2023.02); *G11C 16/0483* (2013.01); *H10B 41/10* (2023.02); *H10B 41/27* (2023.02); *H10B 41/30* (2023.02); *H10B 43/10* (2023.02); *H10B 43/30* (2023.02); *H10W 20/435* (2026.01)

(58) Field of Classification Search
CPC ........ H10B 43/27; H10B 41/30; H10B 41/10; H10B 43/30; H10B 43/10; H10B 41/27; G11C 16/0483; H10W 20/435
See application file for complete search history.

(56) References Cited

U.S. PATENT DOCUMENTS

| | | | | |
|---|---|---|---|---|
| 10,340,285 B2 * | 7/2019 | Ishida | .................. | H10D 62/292 |
| 11,201,169 B2 * | 12/2021 | Lee | ........................ | H10B 43/10 |
| 2021/0020203 A1 * | 1/2021 | Choi | ...................... | G11C 5/063 |
| 2022/0123012 A1 | 4/2022 | Gao et al. | | |

FOREIGN PATENT DOCUMENTS

KR 1020210010210 A 1/2021

* cited by examiner

*Primary Examiner* — Richard A Booth
(74) *Attorney, Agent, or Firm* — WILLIAM PARK AND ASSOCIATES LTD.

(57) ABSTRACT

A semiconductor device including: a gate structure including stacked gate lines; an insulating core located in the gate structure and including a first long axis and a first short axis; a memory layer surrounding the insulating core; first channel pattern and a second channel pattern located facing each other along the first long axis, wherein the first channel pattern and the second channel pattern are located between the insulating core and the memory layer; and a capping layer located between the first channel pattern and the second channel pattern.

17 Claims, 41 Drawing Sheets

A-A'

B-B'

C-C'

D-D'

SEMICONDUCTOR DEVICE AND MANUFACTURING METHOD OF THE SEMICONDUCTOR DEVICE

CROSS-REFERENCE TO RELATED APPLICATION

This application claims priority under 35 U.S.C. § 119(a) to Korean Patent Application No. 10-2022-0166411 filed on Dec. 2, 2022, in the Korean Intellectual Property Office, which is incorporated herein by reference in its entirety.

BACKGROUND

1. Technical Field

Embodiments of the present disclosure generally relate to an electronic device, and more particularly, to a semiconductor device and a manufacturing method of the semiconductor device.

2. Related Art

The degree of integration of a semiconductor device is mainly determined by an area occupied by a unit memory cell. Recently, as the improvement in the degree of integration of a semiconductor device for forming memory cells in a single layer on a substrate reaches a limit, a three-dimensional semiconductor device for stacking memory cells on a substrate has been proposed. Furthermore, in order to improve the operational reliability of such a semiconductor device, various structures and manufacturing methods have been developed.

SUMMARY

In an embodiment, a semiconductor device may include: a gate structure including stacked gate lines; an insulating core located in the gate structure and including a first long axis and a first short axis; a memory layer surrounding the insulating core; a first channel pattern and a second channel pattern located facing each other along the first long axis, wherein the first channel pattern and the second channel pattern are located between the insulating core and the memory layer; and a capping layer including a second short axis and a second long axis, the capping layer located between the first channel pattern and the second channel pattern and protruding beyond both the first channel pattern and the second channel pattern along the second short axis.

In an embodiment, a semiconductor device may include: a first memory string including a first channel pattern; a second memory string adjacent to the first memory string in a first direction and including a second channel pattern; an insulating core located between the first channel pattern and the second channel pattern, and having a first width in the first direction and a second width in a second direction intersecting the first direction, the first width being larger than the second width; a bit line connected to the first memory string and the second memory string; a first drain select line configured to control a connection between the first memory string and the bit line; and a second drain select line configured to control a connection between the second memory string and the bit line.

In an embodiment, a manufacturing method of a semiconductor device may include: forming a stack; forming an opening including a long axis and a short axis in the stack; forming a channel layer in the opening; forming a first barrier layer in the channel layer; forming a second barrier layer in the first barrier layer; forming second barrier patterns located facing each other along the long axis by etching the second barrier layer; forming first barrier patterns located facing each other along the long axis by etching the first barrier layer; and forming a first channel pattern and a second channel pattern by etching the channel layer using the first barrier patterns and the second barrier patterns as etch barriers, respectively.

In an embodiment, a manufacturing method of a semiconductor device may include: forming a stack; forming an opening including a long axis and a short axis in the stack; forming a channel layer in the opening; forming, in the channel layer, a barrier layer including a defect located on the long axis; curing the barrier layer; forming barrier patterns located facing each other along the long axis by etching the barrier layer; and forming a first channel pattern and a second channel pattern by etching the channel layer using the barrier patterns as etch barriers, the first channel pattern and the second channel pattern being located facing each other along the long axis.

In an embodiment, a manufacturing method of a semiconductor device may include: forming a stack; forming an opening including a long axis and a short axis in the stack; forming a channel layer having a first thickness distribution in the opening; forming, in the channel layer, a barrier layer having a second thickness distribution larger than the first thickness distribution; forming barrier patterns located facing each other along the long axis by etching the barrier layer; and forming a first channel pattern and a second channel pattern by etching the channel layer using the barrier patterns as etch barriers, the first channel pattern and the second channel pattern being located facing each other along the long axis.

DETAILED DESCRIPTION

Various embodiments are directed to a semiconductor device having a stable structure and improved characteristics and a manufacturing method of the semiconductor device.

By stacking memory cells in three dimensions, in an embodiment, it is possible to improve the degree of integration of a semiconductor device. Furthermore, in an embodiment, it is possible to provide a semiconductor device having a stable structure and improved reliability.

Hereafter, embodiments in accordance with the technical spirit of the present disclosure will be described with reference to the accompanying drawings. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers etc., present. It will be understood that although the terms first, second, third etc. may be used herein to describe various elements, these elements should not be limited by these terms. These terms are only used to distinguish one element from another element, but not used to define only the element itself or to mean a particular sequence.

Figure 1A:
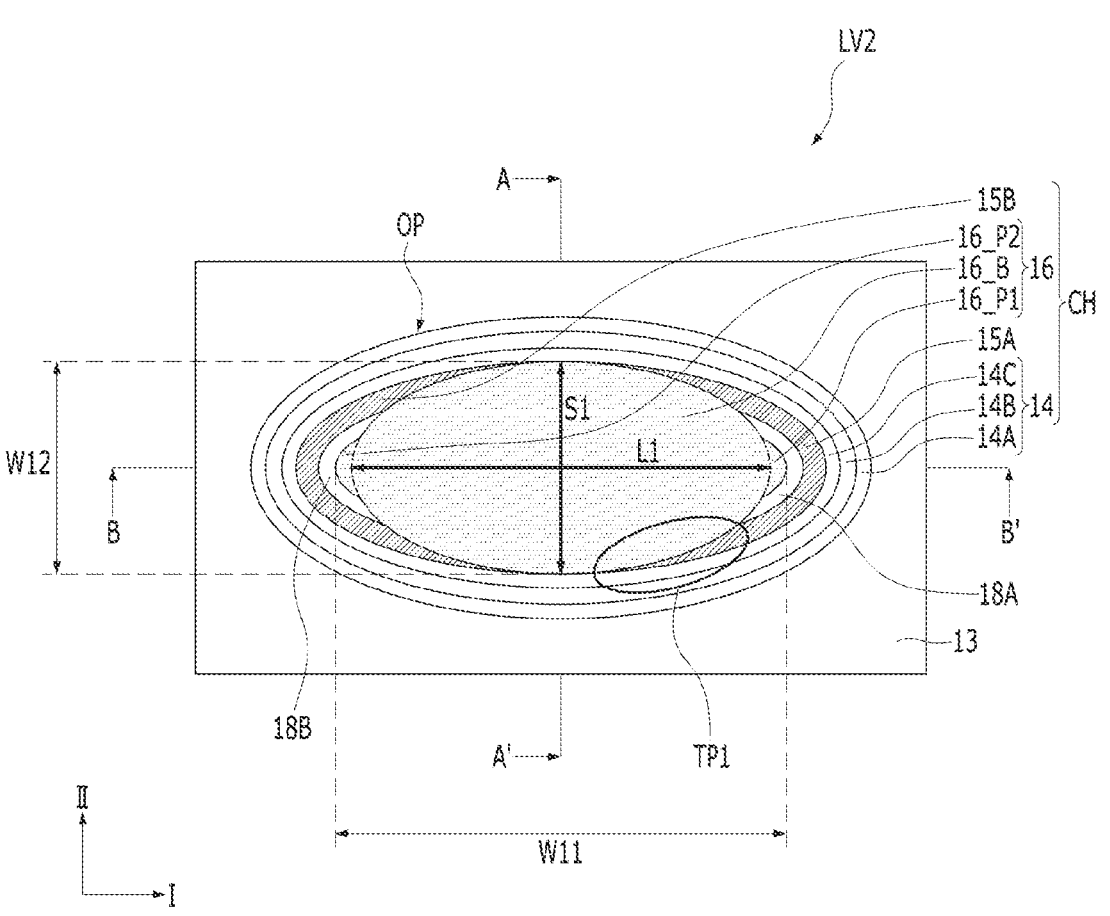
FIGS. 1A, 1B, 1C and 1D are diagrams illustrating the structure of a semiconductor device in accordance with an embodiment.
Figure 1B:
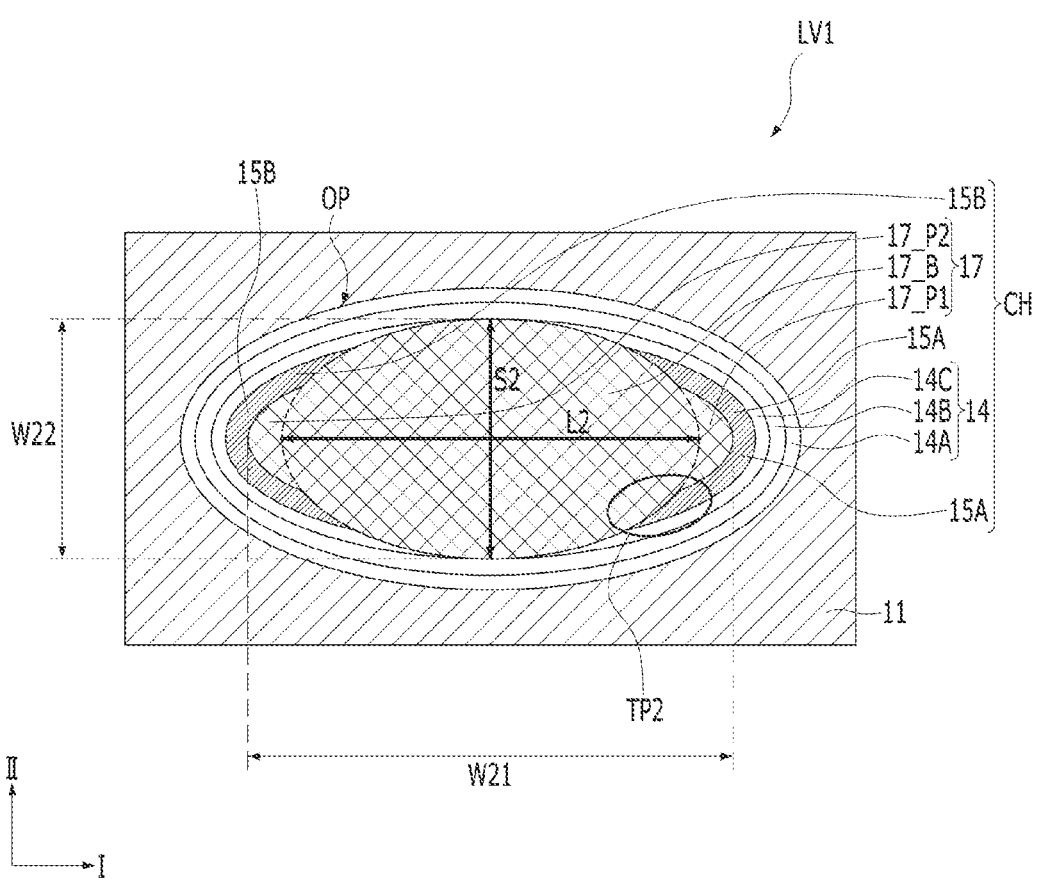
Figure 1C:
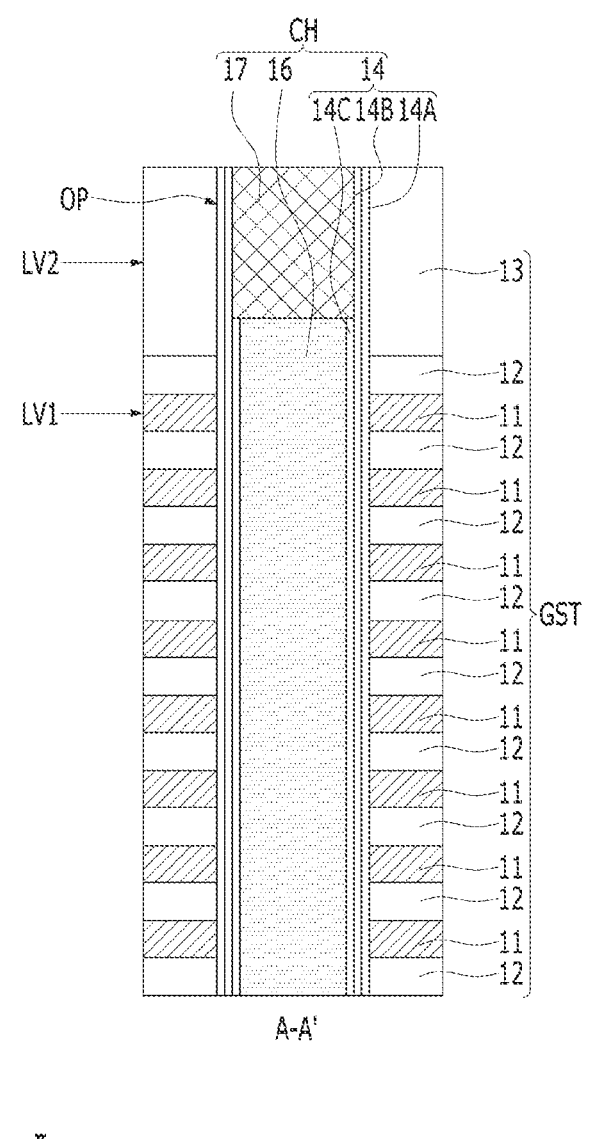
Figure 1D:
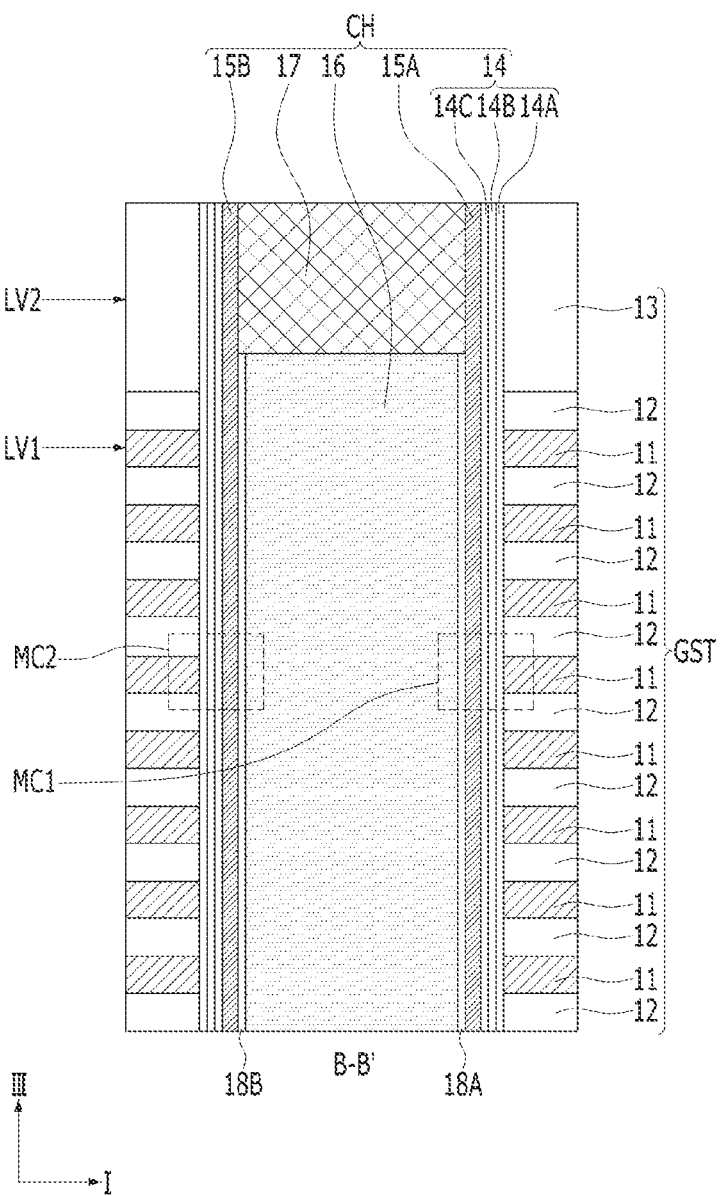

FIG. 1A to FIG. 1D are diagrams illustrating the structure of a semiconductor device in accordance with an embodiment. FIG. 1A may be a plan view at a first level LV1 of FIG. 1C and FIG. 1D and FIG. 1B may be a plan view at a second level LV2 of FIG. 1C and FIG. 1D. FIG. 1C may be a cross-sectional view taken along line A-A' in FIG. 1A and FIG. 1D may be a cross-sectional view taken along line B-B' in FIG. 1A.

Referring to FIG. 1A to FIG. 1D, a semiconductor device may include a gate structure GST and a channel structure CH. The semiconductor device may further include a first barrier pattern 18A or a second barrier pattern 18B, or a combination thereof.

The gate structure GST may be located on a base including a lower structure such as a substrate, a source structure, a peripheral circuit, and an interconnection structure. The gate structure GST may include stacked gate lines 11. The gate lines 11 may be word lines, select lines, or bit lines. The gate lines 11 may each include a conductive material such as polysilicon, tungsten (W), or molybdenum (Mo). As an example, the gate structure GST may include gate lines 11 and insulating layers 12 that are alternately stacked. The gate structure GST may further include a hard mask 13 located on the gate lines 11 and the insulating layers 12. The insulating layers 12 may insulate the stacked gate lines 11 from each other, and may each include an insulating material such as oxide, nitride, or air gap. The hard mask 13 may be a mask pattern used in a manufacturing process of the semiconductor device, and may include oxide, nitride, carbon, or the like.

The channel structure CH may be located in the gate structure GST. An opening OP extending in a third direction III may be located in the gate structure GST, and the channel structure CH may be located in the opening OP. A plane may be defined by a first direction I and a second direction II intersecting the first direction I, and the third direction III may be a direction protruding from the plane. The third direction III may be orthogonal to the plane. The channel structure CH may include a memory layer 14, a first channel pattern 15A, a second channel pattern 15B, an insulating core 16, or a capping layer 17, or a combination thereof. The semiconductor device may also include an electrode structure instead of the channel structure CH, and the channel structure CH may also include a first electrode pattern and a second channel pattern instead of the first channel pattern 15A and the second channel pattern 15B.

The insulating core 16 may be located in the gate structure GST. The insulating core 16 may separate the first channel pattern 15A and the second channel pattern 15B from each other. The insulating core 16 may be located between the first channel pattern 15A and the second channel pattern 15B and may be in direct contact with the memory layer 14. The insulating core 16 may include an insulating material such as oxide, nitride, a void, or air gap.

The insulating core 16 may have a first width W11 in the first direction I and a second width W12 in the second direction II. The first width W11 may be larger than the second width W12. The insulating core 16 may have an elliptical shape in the plane defined by the first direction I and the second direction II. The insulating core 16 may include a first long axis L1 and a first short axis S1. The first long axis L1 may be parallel to the first direction I and the first short axis S1 may be parallel to the second direction II. The first long axis L1 may be larger than the first short axis S1.

The insulating core 16 may include a first body 16_B, and may further include at least one of a first protrusion 16_P1 and a second protrusion 16_P2. The first body 16_B may have an elliptical shape and may include the first long axis L1 and the first short axis S1. The first body 16_B may protrude beyond both the first channel pattern 15A and the second channel pattern 15B. The first protrusion 16_P1 and the second protrusion 16_P2 may protrude from the first body 16_B along the first long axis L1. The first protrusion 16_P1 may protrude from the first body 16_B toward the first channel pattern 15A, and the second protrusion 16_P2 may protrude from the first body 16_B toward the second channel pattern 15B. The first protrusion 16_P1 and the second protrusion 16_P2 may be located facing each other along the first long axis L1.

The first channel pattern 15A and the second channel pattern 15B may surround sidewalls of the insulating core 16. The first channel pattern 15A and the second channel pattern 15B may be regions where channels of a memory cell, a select transistor, and the like are formed. The first channel pattern 15A and the second channel pattern 15B may each include a semiconductor material such as silicon (Si) or germanium (Ge). The first channel pattern 15A and the second channel pattern 15B may be separated from each other by the insulating core 16. The first channel pattern 15A and the second channel pattern 15B may be located facing each other along the first long axis L1. The first channel pattern 15A and the second channel pattern 15B may be located between the insulating core 16 and the memory layer 14. The first channel pattern 15A and the second channel pattern 15B may surround the insulating core 16. The first channel pattern 15A may surround the first protrusion 16_P1, and the second channel pattern 15B may surround the second protrusion 16_P2.

At least one of the first channel pattern 15A and the second channel pattern 15B may include a first tip TP1 partially surrounding the first body 16_B. The first tip TP1 may extend along a curved surface of the first body 16_B and may include a curved surface.

The first barrier pattern 18A and the second barrier pattern 18B may surround sidewalls of the insulating core 16. The first barrier pattern 18A and the second barrier pattern 18B may protect the first channel pattern 15A and the second channel pattern 15B during the manufacturing process. The first barrier pattern 18A and the second barrier pattern 18B may each include an insulating material such as oxide or nitride.

The first barrier pattern 18A may be located between the first channel pattern 15A and the insulating core 16. The first barrier pattern 18A may surround the first protrusion 16_P1 and may include a tip surrounding the curved surface of the first body 16_B. The second barrier pattern 18B may be located between the second channel pattern 15B and the insulating core 16. The second barrier pattern 18B may surround the second protrusion 16_P2 and may include a tip surrounding the curved surface of the first body 16_B. The first barrier pattern 18A and the second barrier pattern 18B may be located facing each other along the first long axis L1.

The memory layer 14 may surround the insulating core 16, the first channel pattern 15A and the second channel pattern 15B. The memory layer 14 may include a blocking layer 14A, a data storage layer 14B, or a tunneling layer 14C, or a combination thereof. The data storage layer 14B may include a floating gate, polysilicon, a charge trap material, nitride, a variable resistance material, or the like. As an example, the tunneling layer 14C may surround the insulating core 16, the first channel pattern 15A, and the second channel pattern 15B. The blocking layer 14A may surround the data storage layer 14B, and the data storage layer 14B may surround the tunneling layer 14C.

The capping layer 17 may be located in the gate structure GST. The capping layer 17 may be located in the memory layer 14 and may be located on the insulating core 16. The capping layer 17 may connect the first channel pattern 15A and the second channel pattern 15B to a bit line. The capping layer 17 may be in direct contact with the first channel pattern 15A and the second channel pattern 15B. The capping layer 17 may include a conductive material such as polysilicon.

The capping layer 17 may have a first width W21 in the first direction I and a second width W22 in the second direction II. The first width W21 may be larger than the second width W22. The capping layer 17 may have a larger size than the insulating core 16. As an example, the first width W21 may be larger than the first width W11, and the second width W22 may be larger than the second width W12.

The capping layer 17 may protrude beyond both the first channel pattern 15A and the second channel pattern 15B along a second short axis S2. The capping layer 17 may have an elliptical shape in the plane defined by the first direction I and the second direction II. The capping layer 17 may include a second long axis L2 and the second short axis S2. The second long axis L2 may be parallel to the first direction I, and the second short axis S2 may be parallel to the second direction II.

The capping layer 17 may include a second body 17_B, and may further include at least one of a first protruding pattern 17_P1 and a second protruding pattern 17_P2. The second body 17_B may have an elliptical shape and may include the second long axis L2 and the second short axis S2. The second body 17_B may protrude beyond both the first channel pattern 15A and the second channel pattern 15B along the second short axis S2. The second body 17_B may protrude into the memory layer 14. As an example, the second body 17_B may extend to the data storage layer 14B through the tunneling layer 14C. The second body 17_B may be in direct contact with the data storage layer 14B.

The first protruding pattern 17_P1 and the second protruding pattern 17_P2 may protrude from the second body 17_B along the second long axis L2. The first protruding pattern 17_P1 may protrude from the second body 17_B toward the first channel pattern 15A, and the second protruding pattern 17_P2 may protrude from the second body 17_B toward the second channel pattern 15B. The first protruding pattern 17_P1 and the second protruding pattern 17_P2 may be located facing each other along the second long axis L2. The first channel pattern 15A may surround the first protruding pattern 17_P1, and the second channel pattern 15B may surround the second protruding pattern 17_P2.

At least one of the first channel pattern 15A and the second channel pattern 15B may include a second tip TP2 partially surrounding the second body 17_B. The second tip TP2 may extend along a curved surface of the second body 17_B and may include a curved surface.

According to the structure described above, the first channel pattern 15A and the second channel pattern 15B may be located in the opening OP of the gate structure GST. The first channel pattern 15A and the second channel pattern 15B may be separated from each other by the insulating core 16. First memory cells MC1 may be located at positions where the first channel pattern 15A intersects the gate lines 11. Second memory cells MC2 may be located at positions where the second channel pattern 15B intersects the gate lines 11. The first memory cell MC1 and the second memory cell MC2 may be located facing each other along the first long axis L1. The first memory cell MC1 and the second memory cell MC2 may be adjacent to each other in the first direction I, and may share the memory layer 14, the insulating core 16, and the capping layer 17.

The first memory cell MC1 and the second memory cell MC2 may be included in different memory strings, respectively. The first memory cells MC1 sharing the first channel pattern 15A may be included in a first memory string, and the second memory cells MC2 sharing the second channel pattern 15B may be included in a second memory string. The first memory string and the second memory string may be adjacent to each other in the first direction I. Accordingly, the first memory string and the second memory string may be located in one opening, which, in an embodiment, makes it possible to improve the degree of integration of the semiconductor device.

Figure 2A:
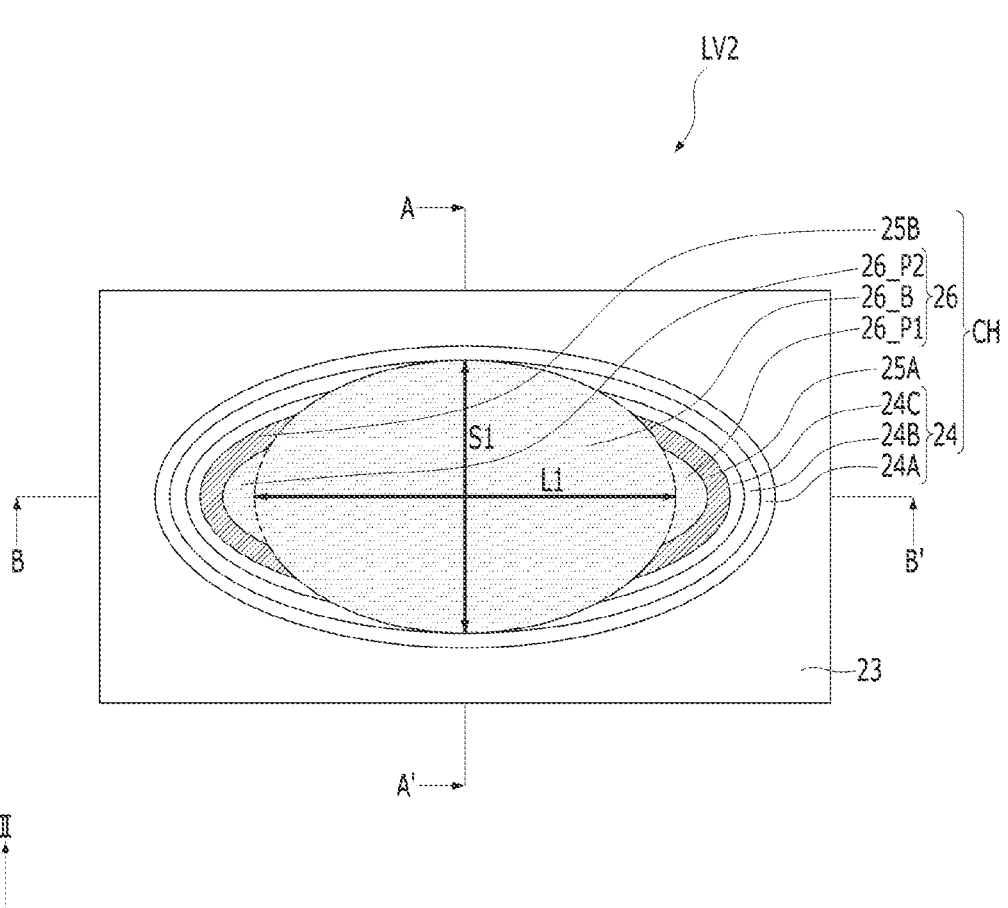
FIGS. 2A, 2B, 2C, and 2D are cross-sectional views illustrating the structure of a semiconductor device in accordance with an embodiment.
Figure 2B:
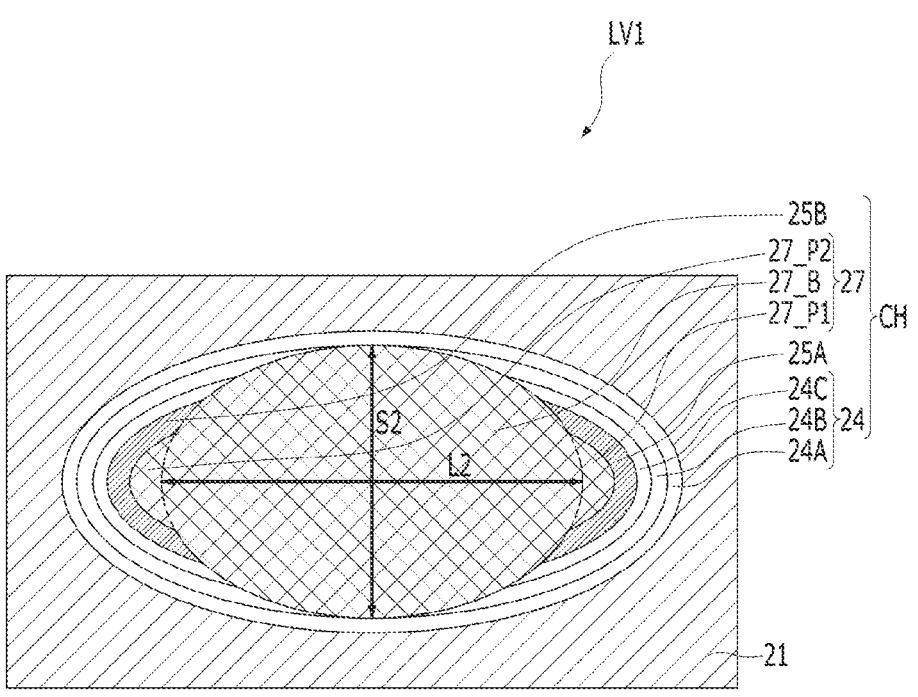
Figure 2B:
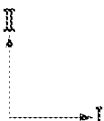
Figure 2C:
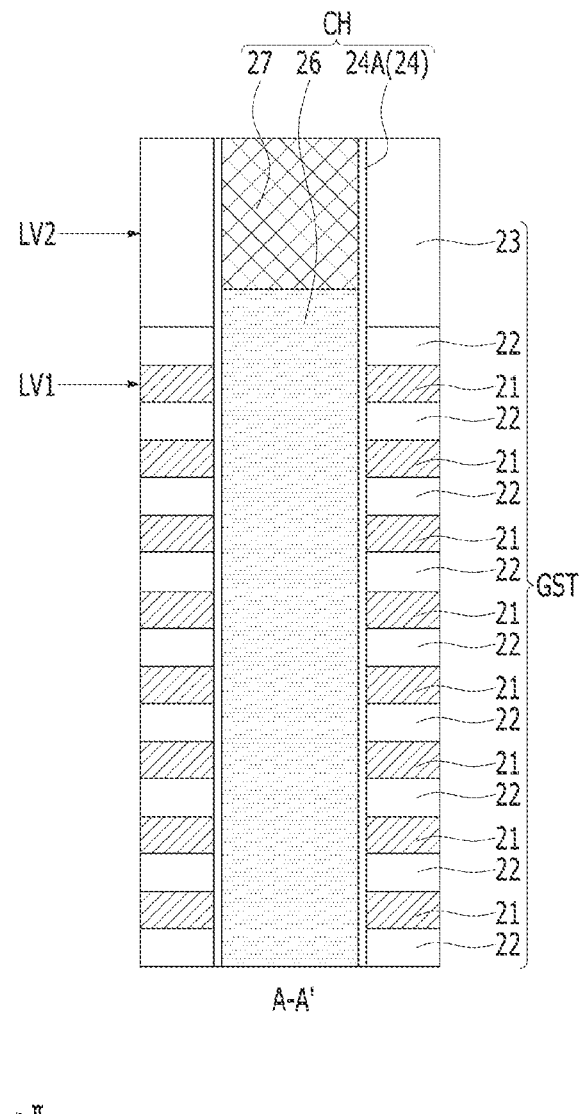
Figure 2D:
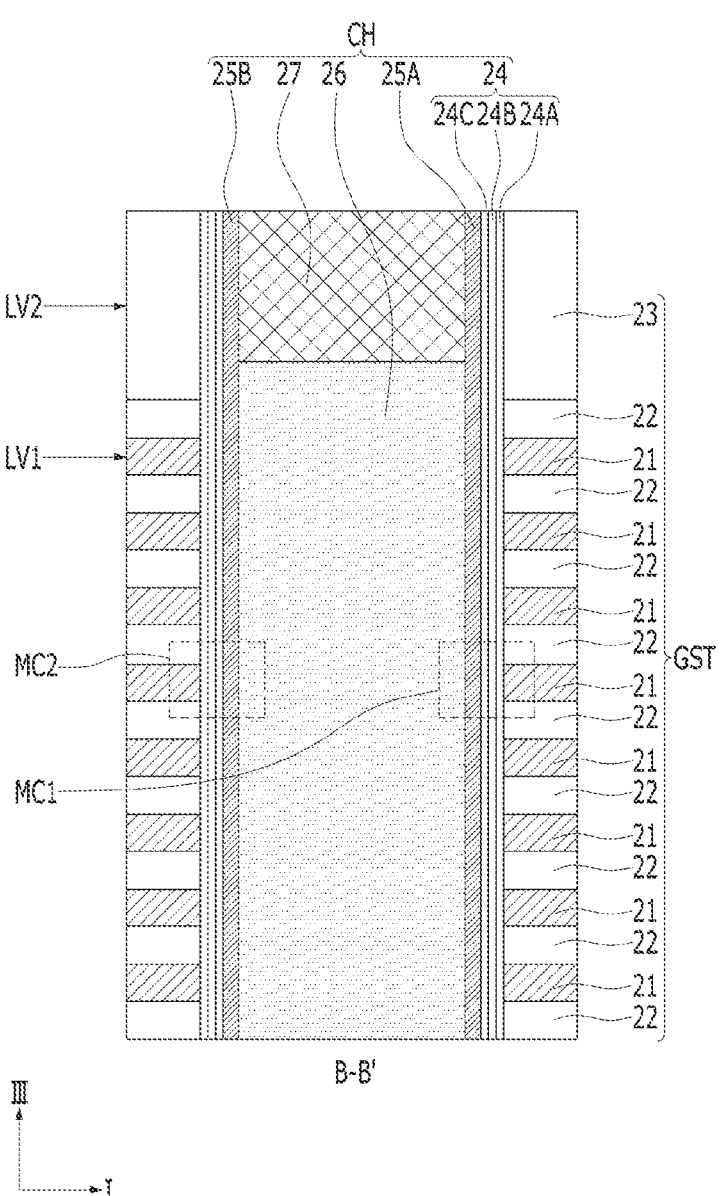

FIG. 2A to FIG. 2D are cross-sectional views illustrating the structure of a semiconductor device in accordance with an embodiment. FIG. 2A may be a plan view at a first level LV1 of FIG. 2C and FIG. 2D and FIG. 2B may be a plan view at a second level LV2 of FIG. 2C and FIG. 2D. FIG. 2C may be a cross-sectional view taken along line A-A' in FIG. 2A and FIG. 2D may be a cross-sectional view taken along line B-B' in FIG. 2A. Hereinafter, the content overlapping with the previously described content will be omitted.

Referring to FIGS. 2A to 2D, the semiconductor device may include a gate structure GST and a channel structure CH. The gate structure GST may include stacked gate lines 21. As an example, the gate structure GST may include the gate lines 21 and insulating layers 22 that are alternately stacked. The gate structure GST may further include a hard mask 23 disposed on the gate lines 21 and the insulating layers 22.

The channel structure CH may be located in the gate structure GST. The channel structure CH may include a memory layer 24, a first channel pattern 25A, a second channel pattern 25B, an insulating core 26, or a capping layer 27, or a combination thereof. The memory layer 24 may surround the insulating core 26, the first channel pattern 25A, and the second channel pattern 25B. The memory layer 24 may include a blocking layer 24A, a data storage layer 24B, or a tunneling layer 24C, or a combination thereof. As an example, the first channel pattern 25A, the second channel pattern 25B, the insulating core 26, and the capping layer 27 may be located in the memory layer 24.

The insulating core 26 may be located in the gate structure GST and may include a first long axis L1 and a first short axis S1. The insulating core 26 may include a first body 26_B, a first protrusion part 26_P1, and a second protrusion part 26_P2. The first body 26_B may include the first long axis L1 and the first short axis S1, and may protrude beyond both the first channel pattern 25A and the second channel pattern 25B along the first short axis S1. The first body 26_B may protrude beyond the first channel pattern 25A and the second channel pattern 25B and into the memory layer 24. As an example, the first body 26_B may extend beyond the first channel pattern 25A and the second channel pattern 25B and to the data storage layer 24B through the tunneling layer 24C or extend beyond the first channel pattern 25A and the second channel pattern 25B and to the blocking layer 24A through the tunneling layer 24C and the data storage layer 24B. The first body 26_B may be in direct contact with the blocking layer 24A. The first protrusion 26_P1 and the second protrusion 26_P2 may be located facing each other along the first long axis L1 and protrude from the first body 26_B along the first long axis L1.

The capping layer 27 may be located between the first channel pattern 25A and the second channel pattern 25B, and may protrude beyond both the first channel pattern 25A and the second channel pattern 25B along a second short axis S2. The capping layer 27 may include a second body 27_B, a first protruding pattern 27_P1, and a second protruding pattern 27_P2. The second body 17_B may include a second long axis L2 and the second short axis S2, and may protrude beyond both the first channel pattern 25A and the second channel pattern 25B along the second short axis S2 into the memory layer 24. As an example, in an embodiment, the second body 27_B may extend beyond the first channel pattern 25A and the second channel pattern 25B and to the data storage layer 24B through the tunneling layer 24C, extend beyond the first channel pattern 25A and the second channel pattern 25B and to the blocking layer 24A through the tunneling layer 24C and the data storage layer 24B, or extend beyond the first channel pattern 25A and the second channel pattern 25B and to the hard mask 23 through the tunneling layer 24C, the data storage layer 24B, and the blocking layer 24A. In an embodiment, the second body 27_B may be in direct contact with the blocking layer 24A or the hard mask 23. The first protruding pattern 27_P1 and the second protruding pattern 27_P2 may be located facing each other along the second long axis L2, and protrude from the second body 27_B along the second long axis L2.

Within the gate structure GST, the first channel pattern 25A and the second channel pattern 25B may extend in the third direction III. At a first level LV1, the first channel pattern 25A and the second channel pattern 25B may be located facing each other along the first long axis L1 and may partially surround sidewalls of the insulating core 26. At a second level LV2, the first channel pattern 25A and the second channel pattern 25B may be located facing each other along the second long axis L2 and may partially surround sidewalls of the capping layer 27.

According to the structure described above, the first channel pattern 25A and the second channel pattern 25B may be separated from each other by the insulating core 26. The tunneling layer 24C surrounding the first channel pattern 25A and the tunneling layer 24C surrounding the second channel pattern 25B may be separated from each other by the insulating core 26. The data storage layer 24B surrounding the first channel pattern 25A and the data storage layer 24B surrounding the second channel pattern 25B may be separated from each other by the insulating core 26. Accordingly, in an embodiment, the data storage layer 24B of a first memory cell MC1 including the first channel pattern 25A and the data storage layer 24B of a second memory cell MC2 including the second channel pattern 25B may be separated from each other, which makes it possible to improve the retention characteristics of the semiconductor device.

Figure 3A:
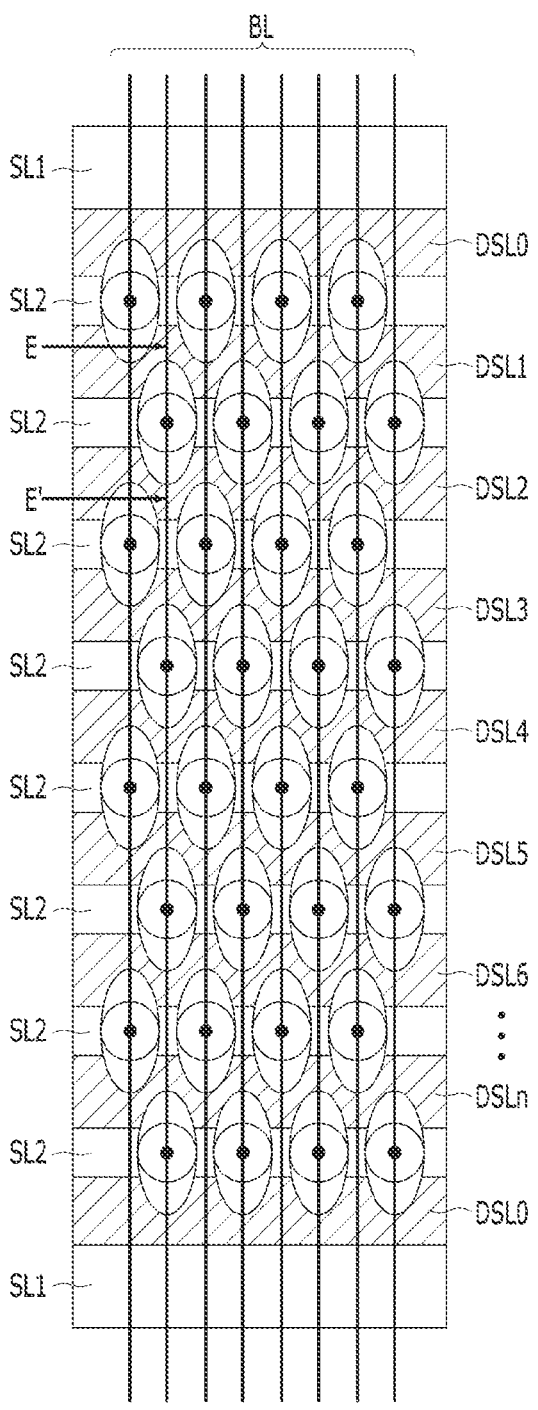
FIG. 3A and FIG. 3B are diagrams illustrating the structure of a semiconductor device in accordance with an embodiment.
Figure 3B:
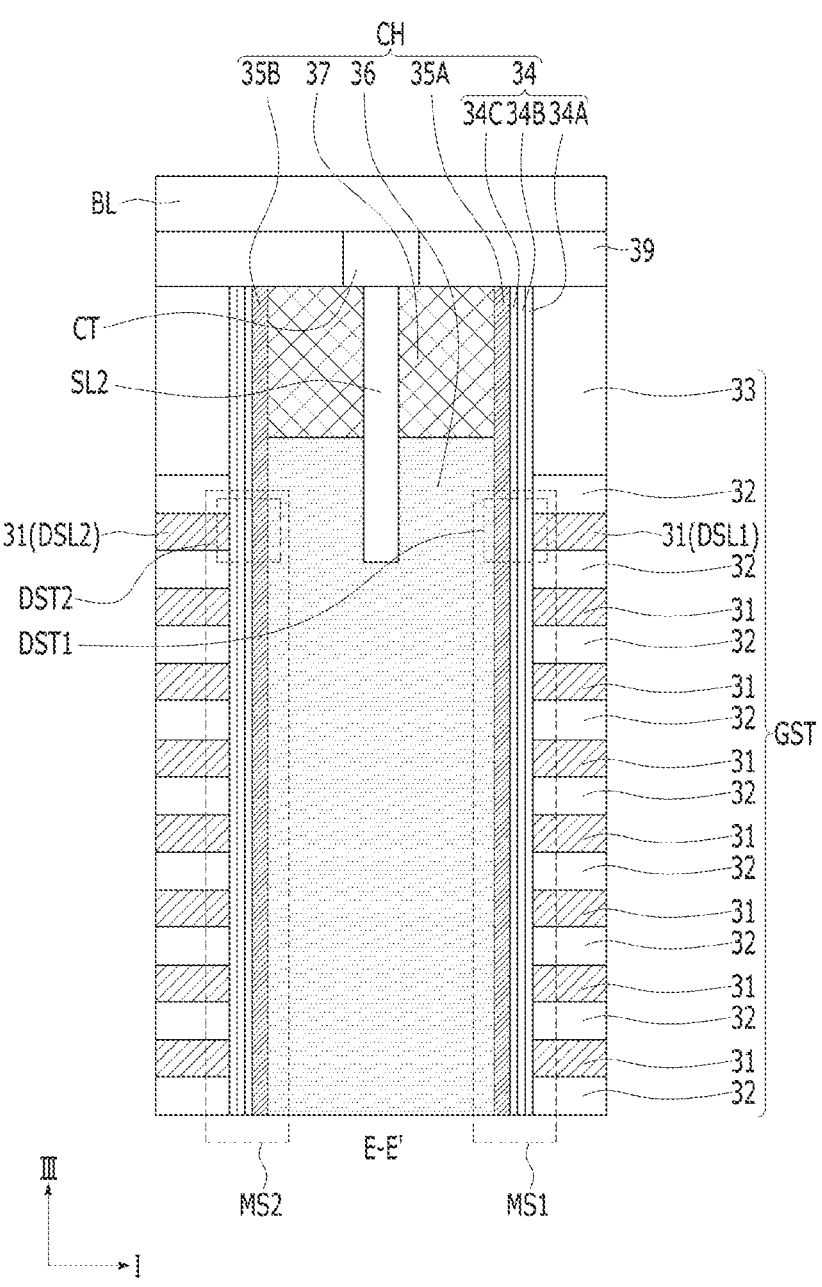

FIG. 3A and FIG. 3B are diagrams illustrating the structure of a semiconductor device in accordance with an embodiment. FIG. 3B may be a cross-sectional view taken along line E-E' in FIG. 3A. Hereinafter, the content overlapping with the previously described content will be omitted.

Referring to FIG. 3A and FIG. 3B, the semiconductor device includes gate structures GST, channel structures CH, a first slit structure SL1, a second slit structure SL2, an interlayer dielectric layer 39, a contact plug CT, and a bit line BL, or a combination thereof.

The gate structure GST may include gate lines 31 and insulating layers 32 that are alternately stacked. As an example, one or more uppermost gate lines 31 may be drain select lines DSL0 to DSLn, one or more lowermost gate lines 31 may be source select lines, and the remaining gate lines 31 may be word lines.

The first slit structure SL1 may be located between the gate structures GST. The gate structures GST may be separated from each other by the first slit structure SL1. The second slit structure SL2 may be located in the gate structure GST. The second slit structure SL2 may have a shallower depth than the first slit structure SL1. As an example, the second slit structure SL2 may pass through at least one uppermost gate line 31. The drain select lines DSL0 to DSLn located at the same level may be separated from one another by the second slit structure SL2.

The channel structures CH may be arranged in the gate structure GST in the first direction I and the second direction II. The channel structures CH may be arranged so that the centers thereof are offset to each other. The channel structure CH may include a first channel pattern 35A, a second channel pattern 35B, a memory layer 34, an insulating core 36, and a capping layer 37, or a combination thereof. The memory layer 34 may include a blocking layer 34A, a data storage layer 34B, and a tunneling layer 34C, or a combination thereof. The second slit structure SL2 may overlap the channel structures CH and may extend in the second direction II through the channel structures CH.

A first memory cell, a select transistor, or the like may be located at positions where the first channel pattern 35A intersects the gate lines 31. As an example, a first drain select transistor DST1 may be located at a position where the first channel pattern 35A intersects a first drain select line DSL1, and a second drain select transistor DST2 may be located at a position where the second channel pattern 35B intersects a second drain select line DSL2. The first drain select transistor DST1 may be included in a first memory string MS1, and the second drain select transistor DST2 may be included in a second memory string MS2.

The first channel pattern 35A and the second channel pattern 35B may be connected to the bit line BL through the capping layer 37. The capping layer 37 and the bit line BL may be connected to each other through the contact plug CT. The bit line BL and the contact plug CT may be located in the interlayer dielectric layer 39. The bit line BL may extend in the first direction I, and the drain select lines DSL0 to DSLn may extend in the second direction II intersecting the first direction I.

The connection between the first channel pattern 35A and the bit line BL may be controlled by the first drain select line DSL1. The connection between the second channel pattern 35B and the bit line BL may be controlled by the second drain select line DSL2. In other words, the connection between the first memory string MS1 and the bit line BL may be controlled by the first drain select line DSL1. The connection between the second memory string MS2 and the bit line BL may be controlled by the second drain select line DSL2.

According to the structure described above, in an embodiment, the first memory string MS1 and the second memory string MS2 may share the capping layer 37 and may be connected to the same bit line BL through the capping layer 37. In an embodiment, by separating the first drain select line DSL1 from the second drain select line DSL2 by the second slit structure SL2, the first memory string MS1 and the second memory string MS2 may be individually driven. In an embodiment, the drain select lines DSL0 located adjacent to the first slit structure SL1 may be simultaneously driven. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

FIG. 4A, FIG. 5A, FIG. 6A, FIG. 7A, and FIG. 8A, FIG. 4B, FIG. 5B, FIG. 6B, FIG. 7B, and FIG. 8B, and FIG. 4C, FIG. 5C, FIG. 6C, FIG. 7C, and FIG. 8C are diagrams for describing a manufacturing method of a semiconductor device in accordance with an embodiment. FIG. 4A, FIG. 5A, FIG. 6A, FIG. 7A, and FIG. 8A may be plan views, respectively, FIG. 4B, FIG. 5B, FIG. 6B, FIG. 7B, and FIG. 8B may be cross-sectional views taken along lines C-C' of FIG. 4A, FIG. 5A, FIG. 6A, FIG. 7A, and FIG. 8A, respectively, and FIG. 4C, FIG. 5C, FIG. 6C, FIG. 7C, and FIG. 8C may be cross-sectional views taken along lines D-D' of FIG. 4A, FIG. 5A, FIG. 6A, FIG. 7A, and FIG. 8A, respectively. Hereinafter, the content overlapping with previously described content will be omitted.

Figure 4A:
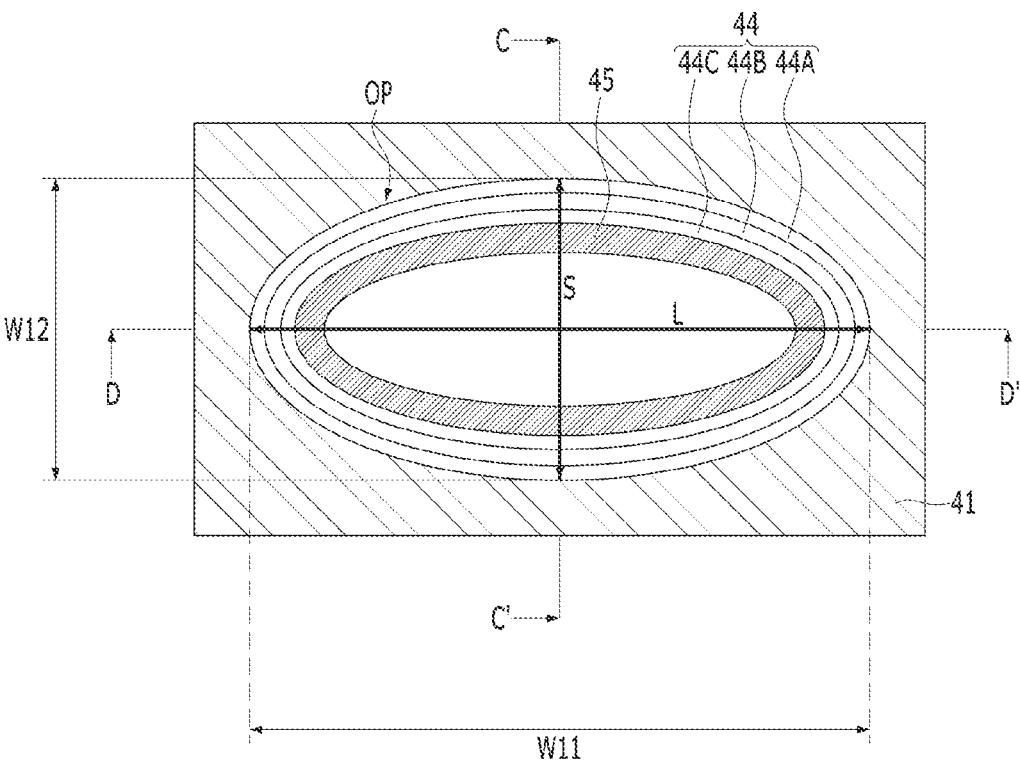
FIG. 4A, FIG. 5A, FIG. 6A, FIG. 7A, and FIG. 8A, FIG. 4B, FIG. 5B, FIG. 6B, FIG. 7B, and FIG. 8B, and FIG. 4C, FIG. 5C, FIG. 6C, FIG. 7C, and FIG. 8C are diagrams for describing a manufacturing method of a semiconductor device in accordance with an embodiment.
Figure 4A:
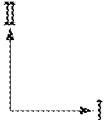
Figure 4B:
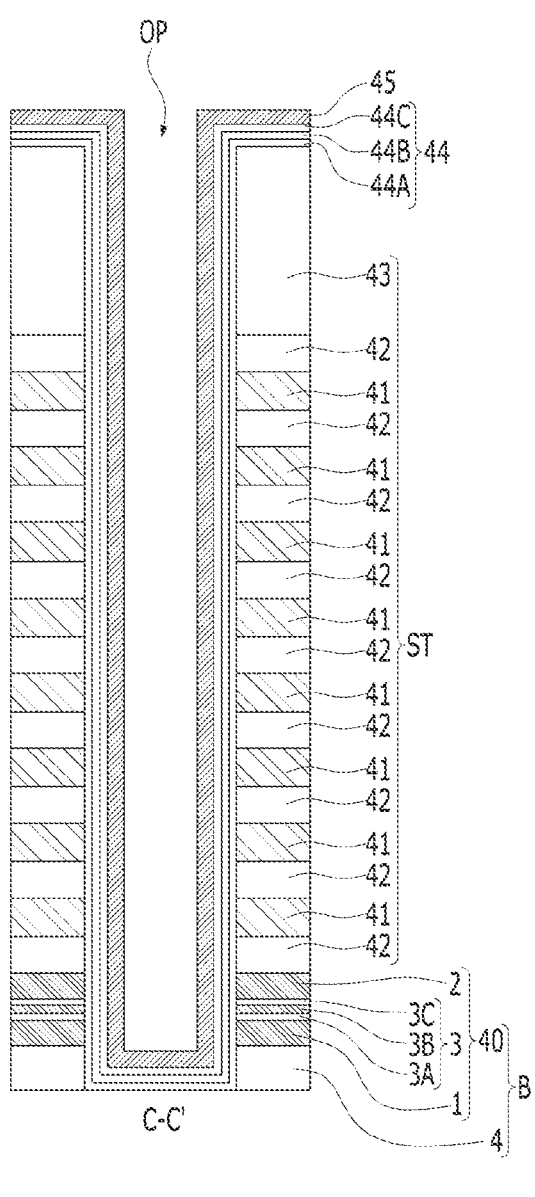
Figure 4B:
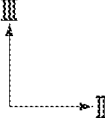
Figure 4C:
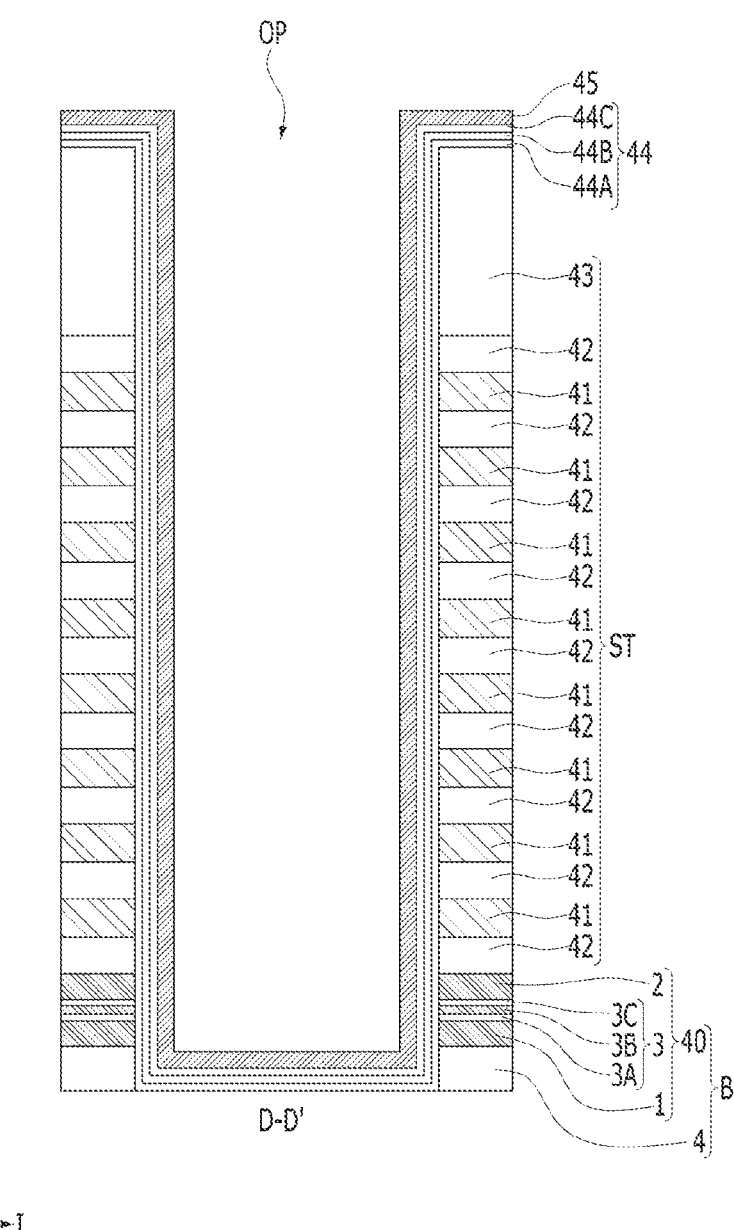

Referring to FIGS. 4A to 4C, a stack ST may be formed on a base B. The base B may include a source structure 40. The source structure 40 may include a first source layer 1, a second source layer 2, or a source sacrificial layer 3, or a combination thereof. The source sacrificial layer 3 may include a first sacrificial layer 3A, a second sacrificial layer 3B, or a third sacrificial layer 3C, or a combination thereof. The second sacrificial layer 3B may include a material having a high etching selectivity with respect to the first sacrificial layer 3A and the third sacrificial layer 3C. As an example, the second sacrificial layer 3B may include polysilicon, and the first sacrificial layer 3A and the third sacrificial layer 3C may each include oxide. The base B may further include a lower structure such as a substrate and a peripheral circuit, and may further include an insulating layer 4 located between the lower structure and the source structure 40.

The stack ST may include first material layers 41 and second material layers 42 that are alternately stacked. The stack ST may further include a hard mask 43 located on the first material layers 41 and the second material layers 42. The first material layers 41 may form a gate electrode of a word line, a select line, a bit line, or the like, and the second material layers 42 may insulate stacked gate electrodes from each other. The first material layers 41 may each include a material having a high etching selectivity with respect to the second material layers 42. For example, the first material layers 41 may each include a sacrificial material such as nitride, and the second material layers 42 may each include an insulating material such as oxide or nitride. As another example, the first material layers 41 may each include a conductive material such as polysilicon, tungsten (W), or molybdenum (Mo), and the second material layers 42 may each include an insulating material such as oxide or nitride.

Subsequently, an opening OP may be formed in the stack ST. The opening OP may extend into the base B through the stack ST. As an example, the opening OP may extend into the source structure 40, or extend into the insulating layer 4 by passing through the source structure 40. The opening OP may have a first width W11 in the first direction I and a second width W12 in the second direction II. As an example, the opening OP may have an elliptical shape in a plane defined by the first direction I and the second direction II. The opening OP may include a long axis L in the first direction I and a short axis S in the second direction II.

Subsequently, a memory layer 44 may be formed in the opening OP. As an example, a blocking layer 44A may be formed in the opening OP, a data storage layer 44B may be formed in the blocking layer 44A, and a tunneling layer 44C may be formed in the data storage layer 44B. The memory layer 44 may extend along an upper surface of the stack ST.

Subsequently, a channel layer 45 may be formed in the opening OP. As an example, the channel layer 45 may include a polysilicon layer. The channel layer 45 may be formed using a deposition process, and may be conformally formed along an inner surface of the opening OP. The channel layer 45 may have a first thickness distribution. As an example, when the channel layer 45 is formed to have different thicknesses according to regions due to characteristics of the deposition process, the first thickness distribution may be calculated by converting a thickness difference according to regions into a numerical value.

Figure 5A:
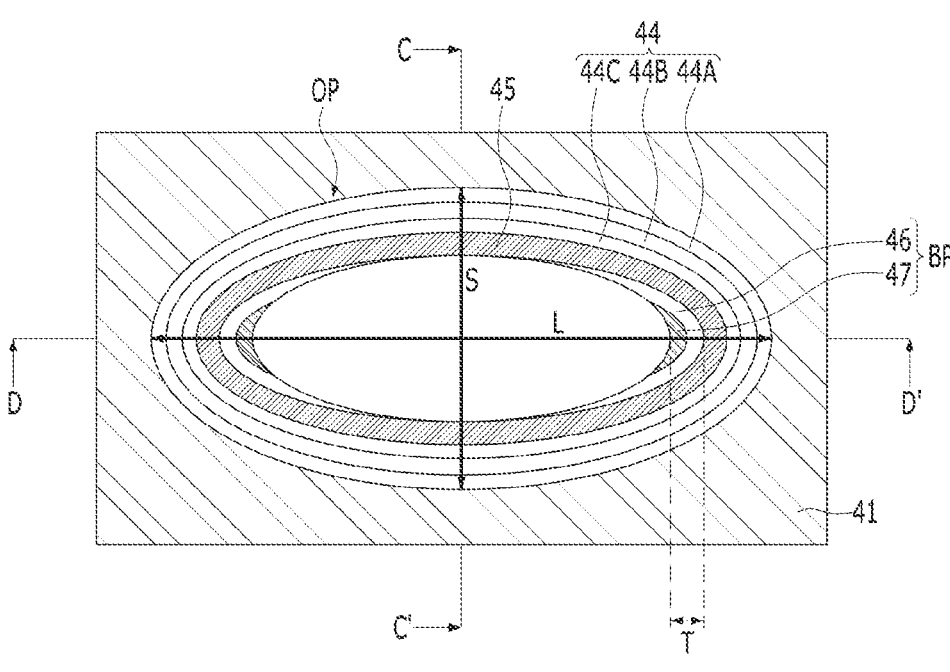
Figure 5B:
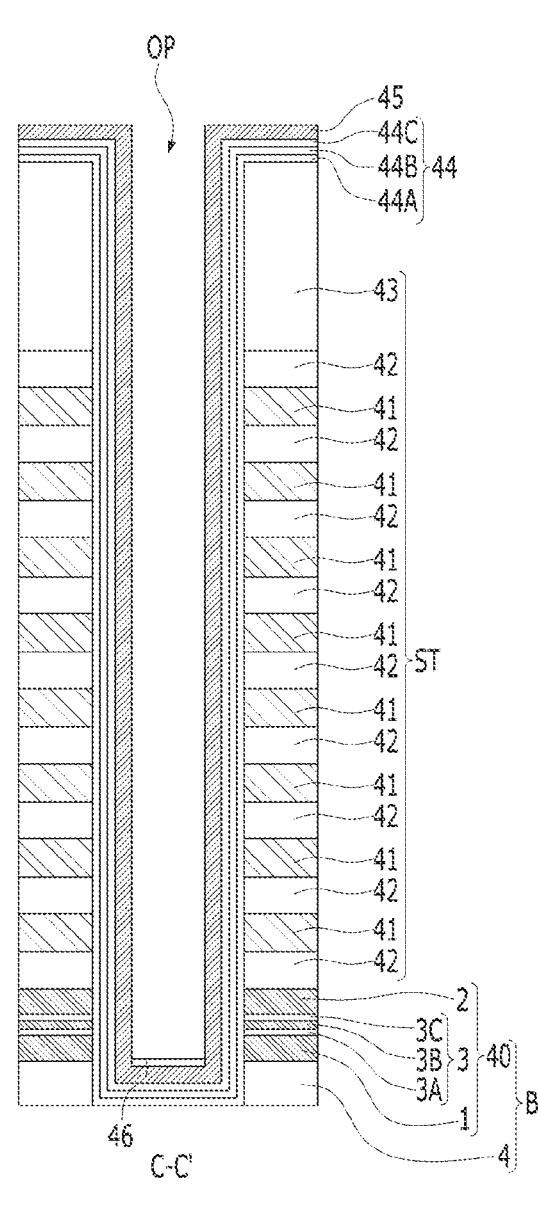
Figure 5C:
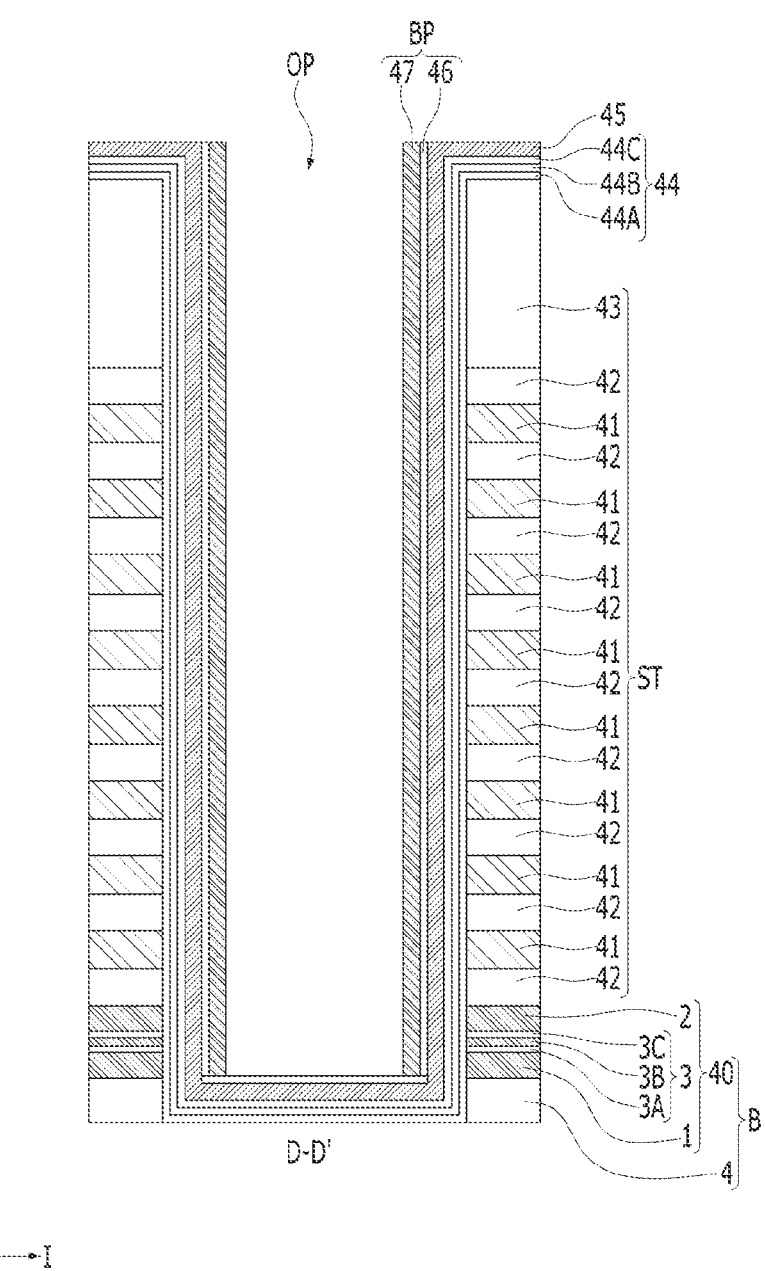

Referring to FIGS. 5A to 5C, barrier patterns BP may be formed in the channel layer 45. The barrier patterns BP may be etch barriers for separating the channel layer 45. As an example, the barrier patterns BP may be formed by forming a barrier layer in the channel layer 45 and then etching the barrier layer. The barrier layer may be formed using a deposition process or an oxidation process. During the process of etching the barrier layer, a portion of the barrier layer located on the short axis S of the opening OP may be etched, and a portion of the barrier layer located on the long axis L of the opening OP may remain to form the barrier patterns BP. In such a case, a portion of the barrier layer may remain on a bottom surface of the opening OP.

A pair of barrier patterns BP may be formed in one opening OP. The pair of barrier patterns BP may be located facing each other along the long axis L. The pair of barrier patterns BP may have a symmetrical shape with respect to the short axis S. The pair of barrier patterns BP may be separated from each other, and the channel layer 45 may be exposed between the barrier patterns BP.

The barrier patterns BP may be formed along an inner surface of the channel layer 45 and may have different thicknesses according to regions. The barrier pattern BP may have the thickest thickness T at the long axis L, and may decrease in thickness as it moves away from the long axis L or approaches the short axis S. The barrier pattern BP may have a second thickness distribution larger than the first thickness distribution.

The barrier patterns BP may include a material having an etching selectivity with respect to the channel layer 45. The barrier patterns BP may include a non-conductive material or a conductive material, or a combination thereof. As an example, the barrier patterns BP may include an oxide layer, a nitride layer, a carbon layer, a polysilicon layer, or a metal layer, or a combination thereof.

The barrier pattern BP may be a multilayer. The barrier pattern BP may include a first sub-barrier pattern 46 and a second sub-barrier pattern 47. The first sub-barrier pattern 46 may include a material having a high etching selectivity with respect to the second sub-barrier pattern 47. The first barrier pattern 46 may include a material having a high etching selectivity with respect to the channel layer 45. As an example, the channel layer 45 may include polysilicon, the first sub-barrier pattern 46 may include oxide, and the second sub-barrier pattern 47 may include polysilicon.

Figure 6A:
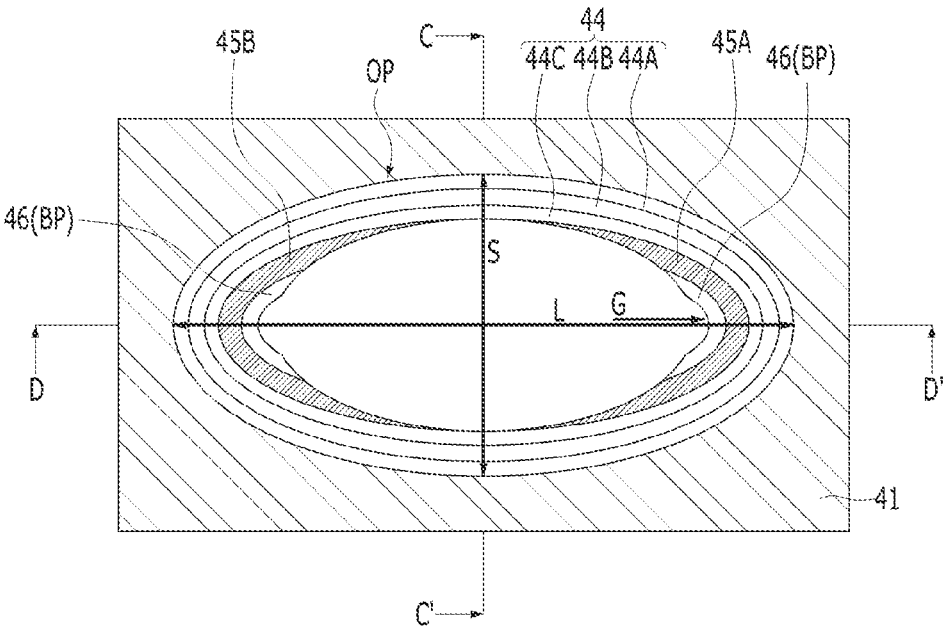
Figure 6A:
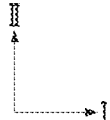
Figure 6B:
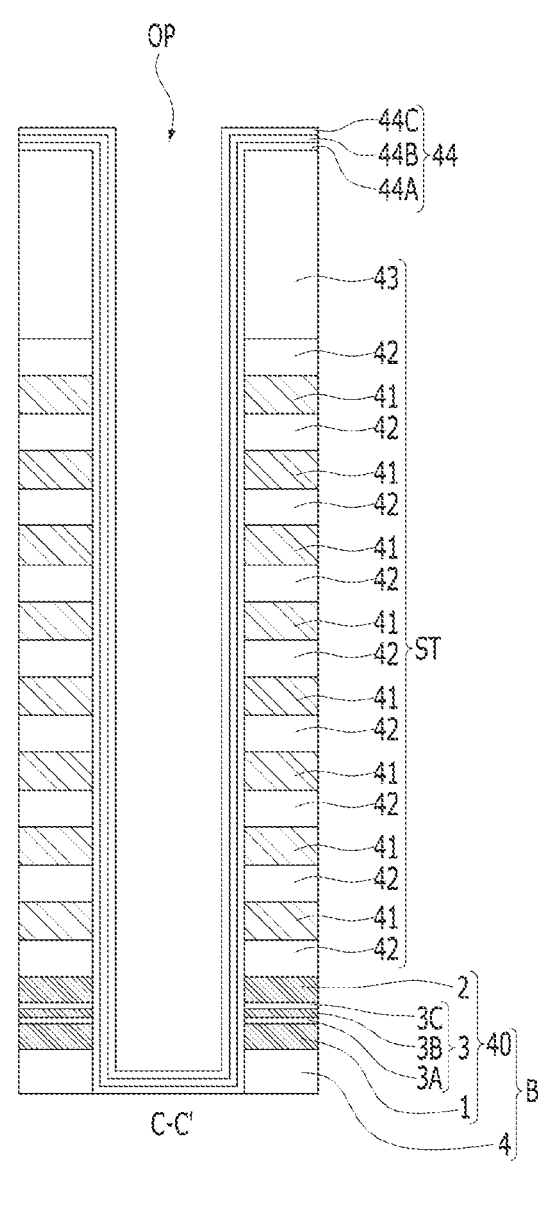
Figure 6B:
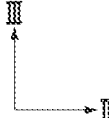
Figure 6C:
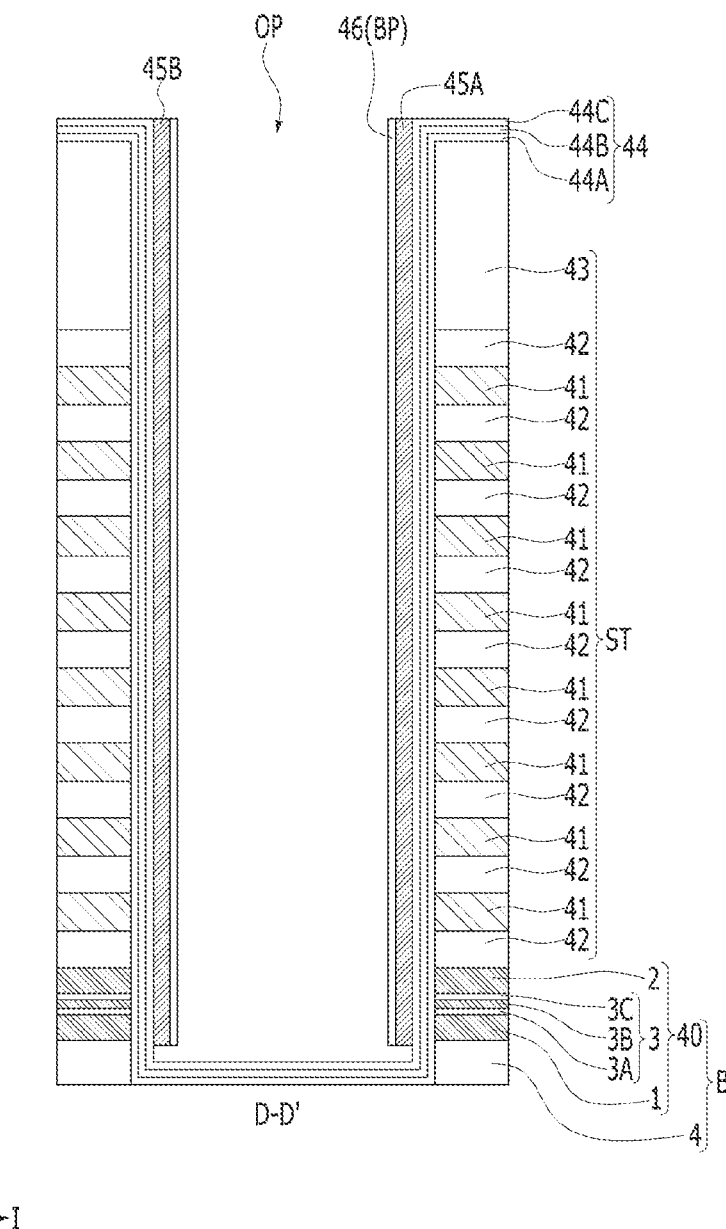

Referring to FIGS. 6A to 6C, a first channel pattern 45A and a second channel pattern 45B may be formed. As an example, the channel layer 45 may be etched using the barrier patterns BP as etch barriers. Since a portion of the channel layer 45 located on the long axis L is protected by the barrier patterns BP and a portion of the channel layer 45 located on the short axis S is exposed by the barrier patterns BP, the portion of the channel layer 45 located on the short axis S may be selectively etched. Accordingly, the first channel pattern 45A and the second channel pattern 45B located facing each other along the long axis L may be formed. The first channel pattern 45A and the second channel pattern 45B may be adjacent to each other in the first direction I and may be separated from each other.

When the channel layer 45 is etched, the barrier pattern BP may be partially etched according to the material of the barrier pattern BP. As an example, when the channel layer 45 is etched, at least a part of the first sub-barrier pattern 46 and the second sub-barrier pattern 47 may be etched. The etching rate of the second sub-barrier pattern 47 may be higher than that of the first sub-barrier pattern 46, and the second sub-barrier pattern 47 may be removed in the process of etching the channel layer 45. A remaining first sub-barrier pattern 46 may protect inner surfaces of the first channel pattern 45A and the second channel pattern 45B. An inner surface of the first sub-barrier pattern 46 may be exposed by removing the second sub-barrier pattern 47, and the first sub-barrier pattern 46 may include a groove G.

Figure 7A:
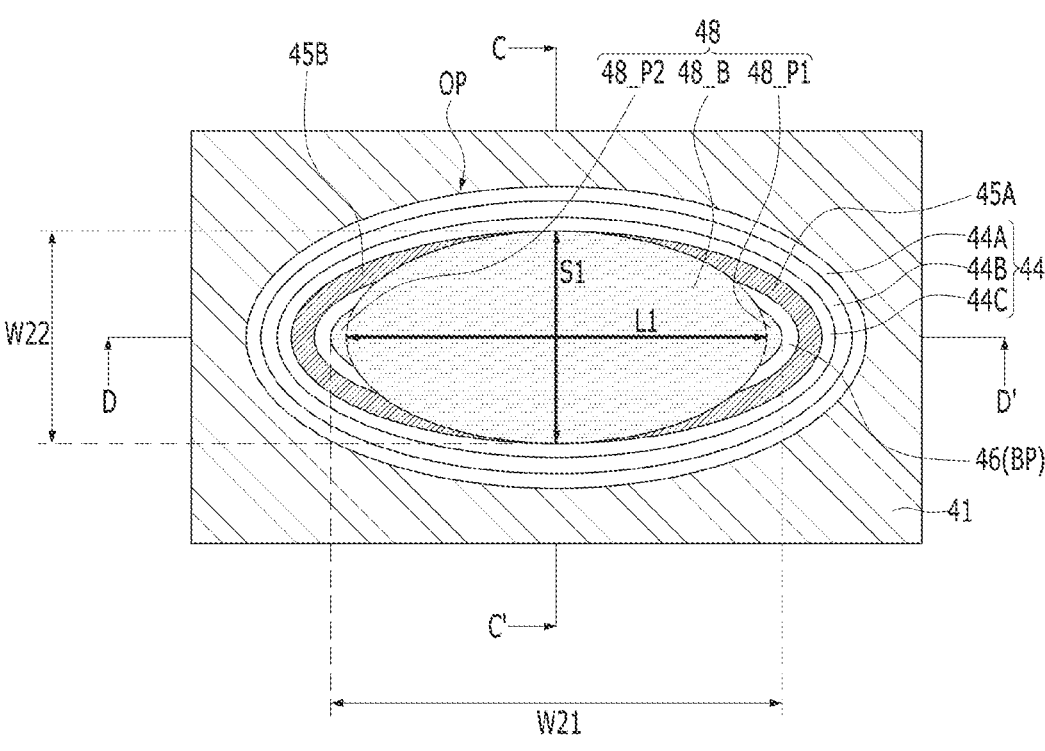
Figure 7A:
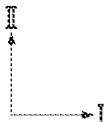
Figure 7B:
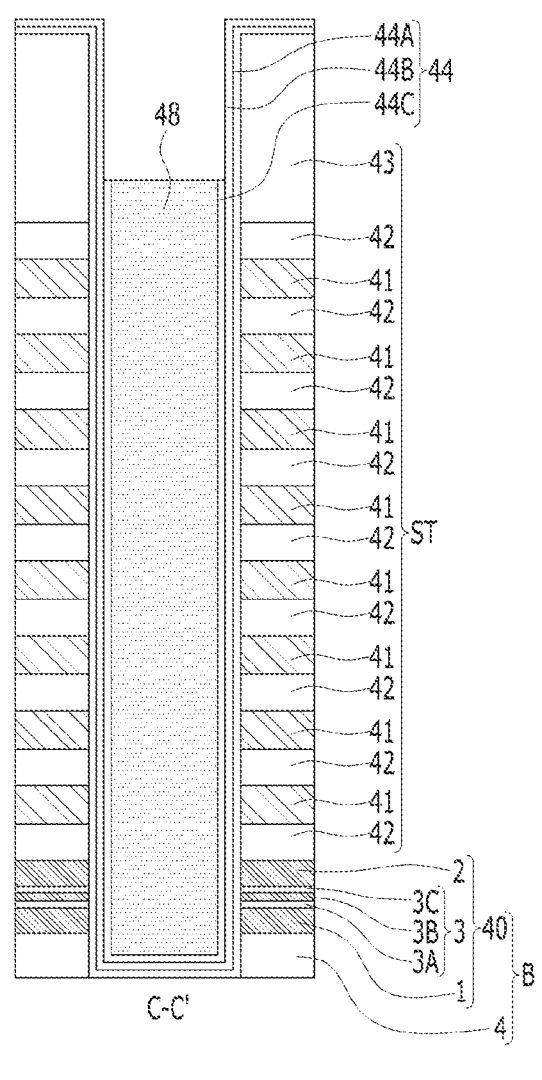
Figure 7B:
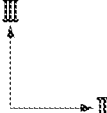
Figure 7C:
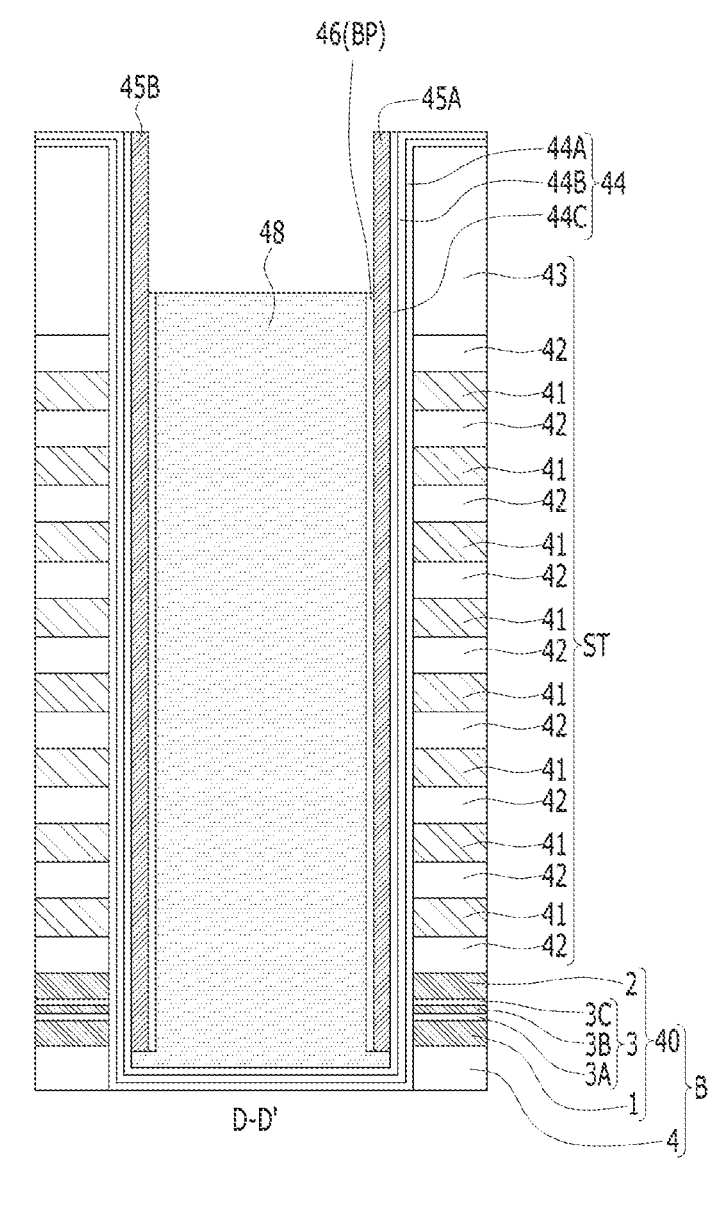

Referring to FIGS. 7A to 7C, an insulating core 48 may be formed in the opening OP. As an example, the insulating core 48 may be formed by forming an insulating layer in the opening OP and then recessing the insulating layer. An upper surface of the insulating core 48 may be located lower than an upper surface of the hard mask 43 and may be located higher than a lower surface of the hard mask 43.

The memory layer 44 may be partially etched during the process of recessing the insulating layer. As an example, in the process of forming the insulating core 48, the tunneling layer 44C may be etched along with the insulating layer. In the process of recessing the insulating layer, at least a part of the first sub-barrier pattern 46 may be etched, and the first channel pattern 45A and the second channel pattern 45B may be exposed.

The insulating core 48 may be located in the memory layer 44. The insulating core 48 may have a first width W21 in the first direction I and a second width W22 in the second direction II, and the first width W21 may be larger than the second width W22. The insulating core 48 may include a body 48_B. The insulating core 48 may further include a first protrusion 48_P1 or a second protrusion 48_P2, or a combination thereof.

The body 48_B may be located between the first channel pattern 45A and the second channel pattern 45B, and may separate the first channel pattern 45A and the second channel pattern 45B from each other. The body 48_B may protrude between the first channel pattern 45A and the second channel pattern 45B, and may be in direct contact with the memory layer 44. The body 48_B may include a first long axis L1 parallel to the first direction I and a first short axis S1 parallel to the second direction II.

The first protrusion 48_P1 and the second protrusion 48_P2 may be located facing each other along the first long axis L1. The first protrusion 48_P1 may protrude from the body 48_B toward the first channel pattern 45A. The first protrusion 48_P1 may be located in the groove G of the first channel pattern 45A, and the first channel pattern 45A may surround the first protrusion 48_P1. The second protrusion 48_P2 may protrude from the body 48_B toward the second channel pattern 45B. The second protrusion 48_P2 may be located in the groove G of the second channel pattern 45B, and the second channel pattern 45B may surround the second protrusion 48_P2.

Figure 8A:
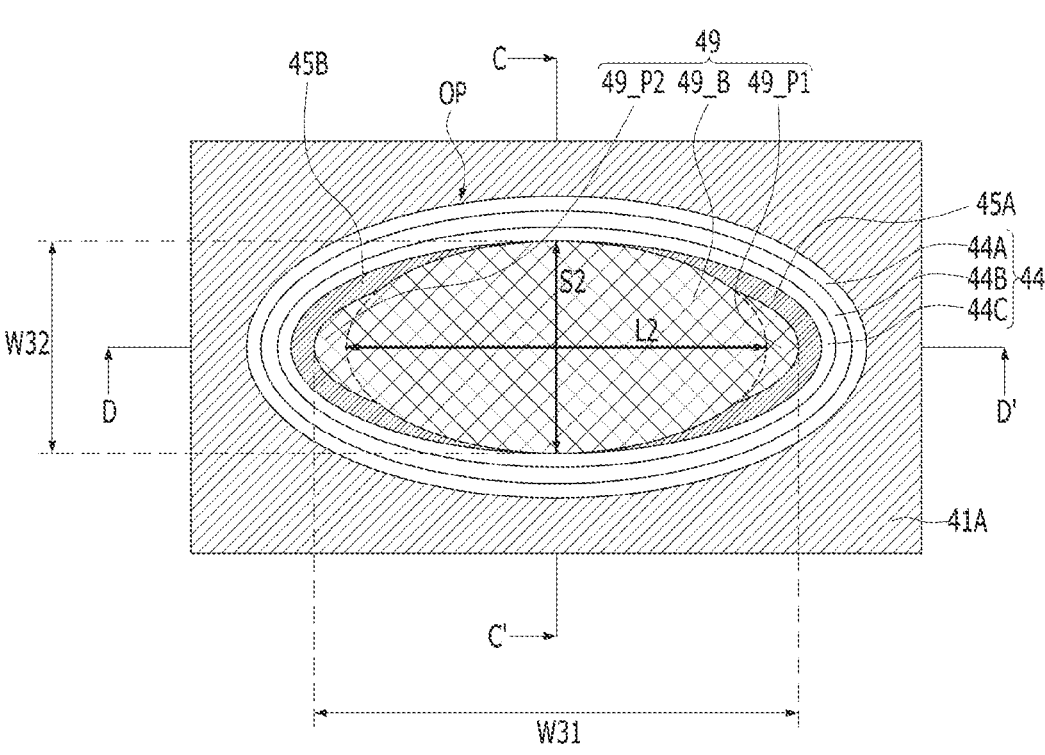
Figure 8A:
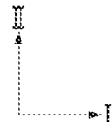
Figure 8B:
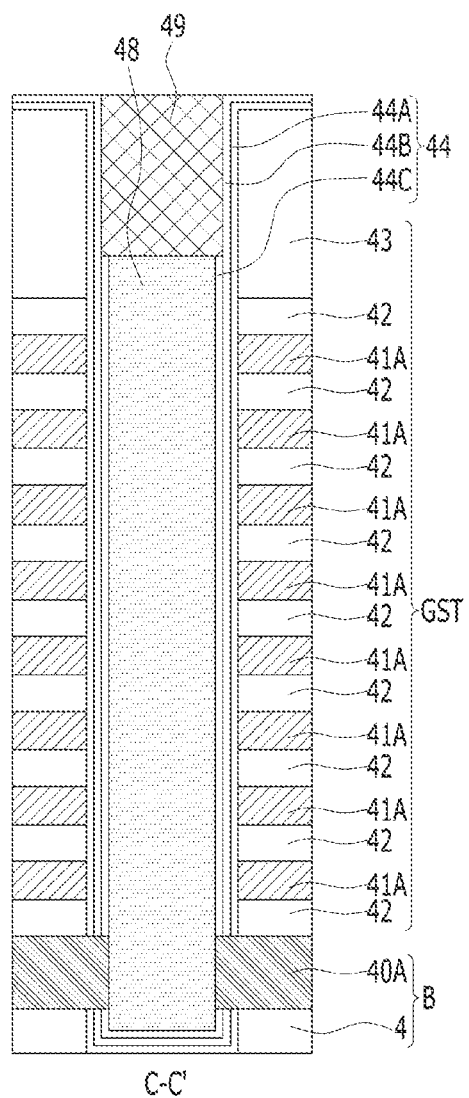
Figure 8B:
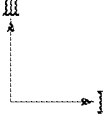
Figure 8C:
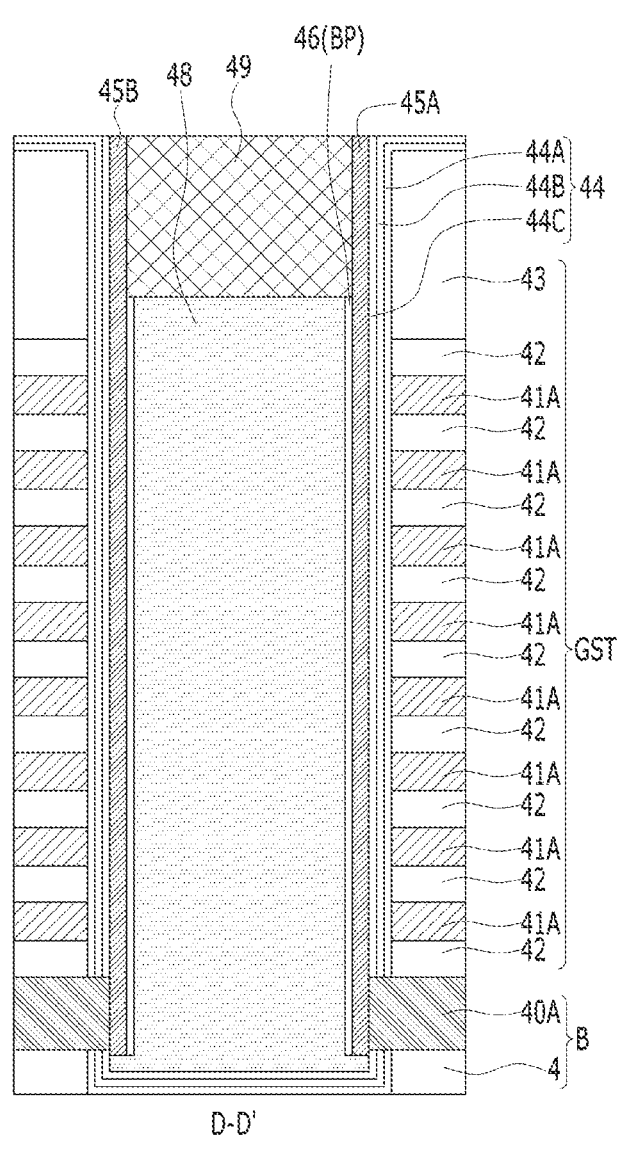

Referring to FIGS. 8A to 8C, a capping layer 49 may be formed in the opening OP. The capping layer 49 may have a first width W31 in the first direction I and a second width W32 in the second direction II, and the first width W31 may be larger than the second width W32. The capping layer 49 may have a larger size than the insulating core 48. The first width W31 may be larger than the first width W21, and the second width W32 may be larger than the second width W22.

The capping layer 49 may include a body 49_B. The body 49_B may be in direct contact with the first channel pattern 45A and the second channel pattern 45B, and may interconnect the first channel pattern 45A and the second channel pattern 45B. The body 49_B may protrude between the first channel pattern 45A and the second channel pattern 45B, and may be in direct contact with the memory layer 44. The body 49_B may be located in the memory layer 44 or may protrude into the memory layer 44. As an example, the body 49_B may extend to the data storage layer 44B by passing through the tunneling layer 44C. The body 49_B may include a second long axis L2 parallel to the first direction I and a second short axis S2 parallel to the second direction II.

The capping layer 49 may further include a first protruding pattern 49_P1 or a second protruding pattern 49_P2, or a combination thereof. The first protruding pattern 49_P1 and the second protruding pattern 49_P2 may be located facing each other along the second long axis L2. The first protruding pattern 49_P1 may protrude from the body 49_B toward the first channel pattern 45A. The first channel pattern 45A may surround the first protruding pattern 49_P1. The second protruding pattern 49_P2 may protrude from the body 49_B toward the second channel pattern 45B. The second channel pattern 45B may surround the second protruding pattern 49_P2.

Subsequently, the source structure 40 may be replaced with a source structure 40A connected to the first channel pattern 45A and the second channel pattern 45B. As an example, after an opening is formed by removing the source sacrificial layer 3, the memory layer 44 exposed through the opening is etched. Accordingly, the first channel pattern 45A and the second channel pattern 45B may be exposed. Subsequently, a third source layer 5 connected to the first channel pattern 45A and the second channel pattern 45B may be formed in the opening.

Subsequently, the first material layers 41 may be replaced with third material layers 41A. As an example, when the first material layers 41 each include a sacrificial material, the first material layers 41 may be replaced with conductive layers. As an example, when the first material layers 41 each include a conductive material, a silicidation process or the like may be performed in order to reduce the resistance of the first material layers 41. Accordingly, a gate structure GST including the second material layers 42 and the third material layers 41A that are alternately stacked may be formed.

Subsequently, although not illustrated in the drawings, a process for forming a contact plug, a bit line, and the like connected to the capping layer 49 may be additionally performed.

According to the manufacturing method described above, the barrier patterns BP may be formed in the opening OP having an elliptical shape. The channel layer 45 may be separated into the first channel pattern 45A and the second channel pattern 45B by using the barrier patterns BP. Accordingly, a first memory cell including the first channel pattern 45A and a second memory cell including the second channel pattern 45B may be formed in one opening OP. A first memory string including the first memory cell and a second memory string including the second memory cell may be formed in one opening OP.

FIG. 9A to 9E are diagrams for describing a manufacturing method of a semiconductor device in accordance with an embodiment. Hereinafter, the content overlapping with the previously described content will be omitted.

Figure 9A:
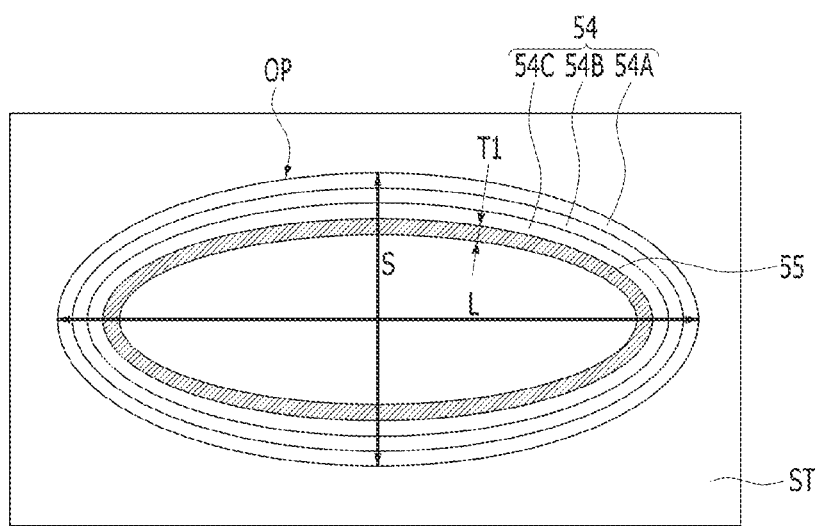
FIGS. 9A, 9B, 9C, 9D, and 9E are diagrams for describing a manufacturing method of a semiconductor device in accordance with an embodiment.
Figure 9A:
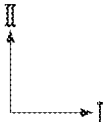

Referring to FIG. 9A, an opening OP may be formed in a stack ST. The opening OP may have an elliptical shape and may include a long axis L and a short axis S. The long axis L may be parallel to the first direction I, and the short axis S may be parallel to the second direction II intersecting the first direction I. Subsequently, a memory layer 54 may be formed in the opening OP. The memory layer 54 may include at least one of a blocking layer 54A, a data storage layer 54B, and a tunneling layer 54C, or a combination thereof.

Subsequently, a channel layer 55 may be formed in the memory layer 54. The channel layer 55 may be formed using a deposition process and may have a uniform thickness along an inner surface of the memory layer 54. The channel layer 55 may have a first thickness T1 and may have a first thickness distribution. The first thickness T1 may be a minimum thickness, a maximum thickness, or an average thickness of the channel layer 55.

Figure 9B:
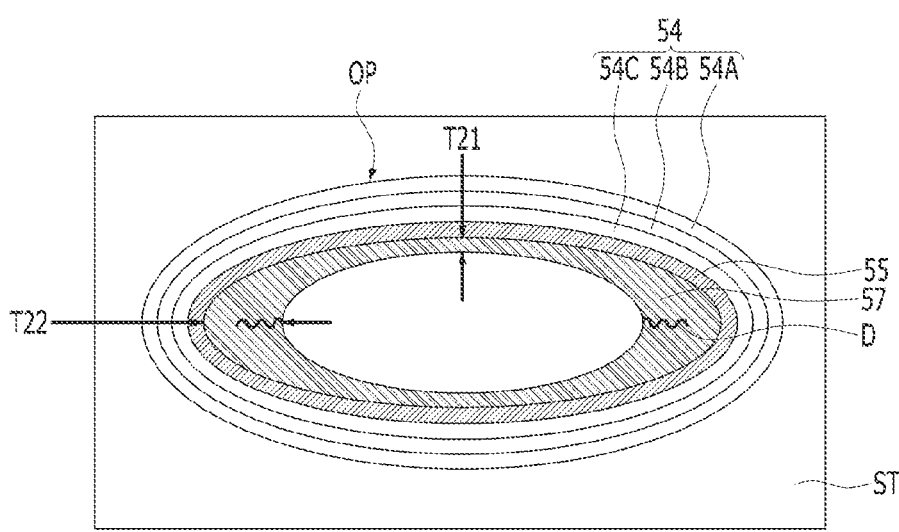
Figure 9B:
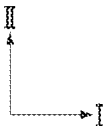

Referring to FIG. 9B, a barrier layer 57 may be formed in the channel layer 55. The barrier layer 57 may be formed using a deposition process, and may be conformally formed along a surface of the channel layer 55. The barrier layer 57 may have different thicknesses according to regions. The barrier layer 57 may have a first thickness T21 at the short axis S and may have a second thickness T22 at the long axis L. The second thickness T22 may be larger than the first thickness T21. The barrier layer 57 may have a second thickness distribution larger than the first thickness distribution.

A difference in the thickness of the barrier layer 57 between the long axis L and the short axis S may be caused in a process of depositing a barrier material in the opening OP having an elliptical shape. Since the width of the opening OP in the second direction II is narrower at the long axis L than at the short axis S, surfaces facing each other in the second direction II may come into contact with each other in the process in which the thickness is increased by depositing the barrier material. Accordingly, the barrier layer 57 may have a thicker thickness at the long axis L than at the short axis S.

The barrier layer 57 may include defects D located on the long axis L. The defects D may be caused during the deposition process and may include a seam, an interface, and the like. As an example, depending on the shape of the opening OP, the barrier material might not be deposited in a partial region, and a seam may be formed as an empty space. Alternatively, an interface may be formed because two surfaces in contact with each other in the deposition process is not chemically bonded.

Figure 9C:
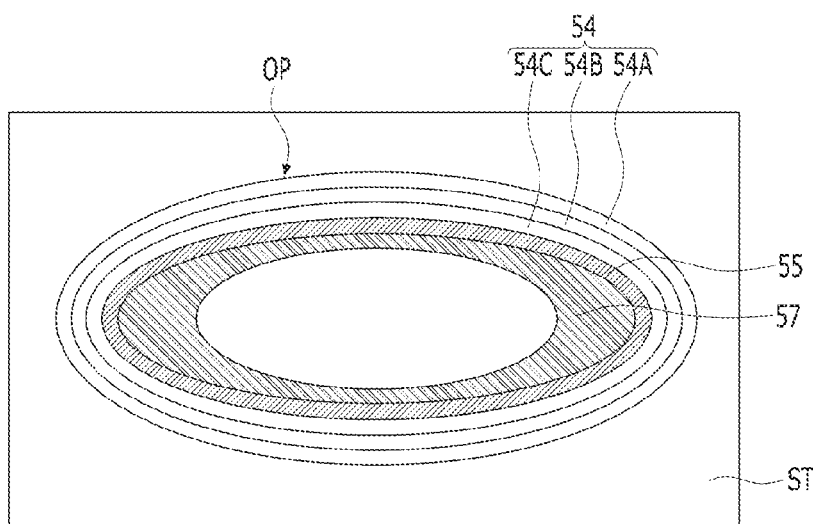
Figure 9C:
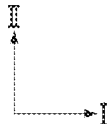

Referring to FIG. 9C, the barrier layer 57 may be cured. The barrier layer 57 may include a material capable of curing the defects D. As an example, the barrier layer 57 may include a grain structure, and may include a material which enables grain growth. The barrier layer 57 may include polysilicon or metal, or a combination thereof.

The barrier layer 57 may be cured through a heat treatment process. The heat treatment process may grow grains in the defects D, so that the defects D may be removed. As an example, after the barrier layer 57 including the defects D is formed by depositing polysilicon, grains of the polysilicon may be grown in the defects D through the heat treatment process.

When the barrier layer 57 includes the defects D, the defects D may be used as a path through which an etching chemical is introduced in a subsequent etching process. An etching chemical such as an etching gas or an etchant may be introduced into the barrier layer 57 through the defects D, and an etching rate at the long axis L may become larger than those in remaining portions. Accordingly, the defects D may be removed or reduced by curing the barrier layer 57, which makes it possible to prevent or reduce damage to the barrier layer 57 in a subsequent etching process.

Figure 9D:
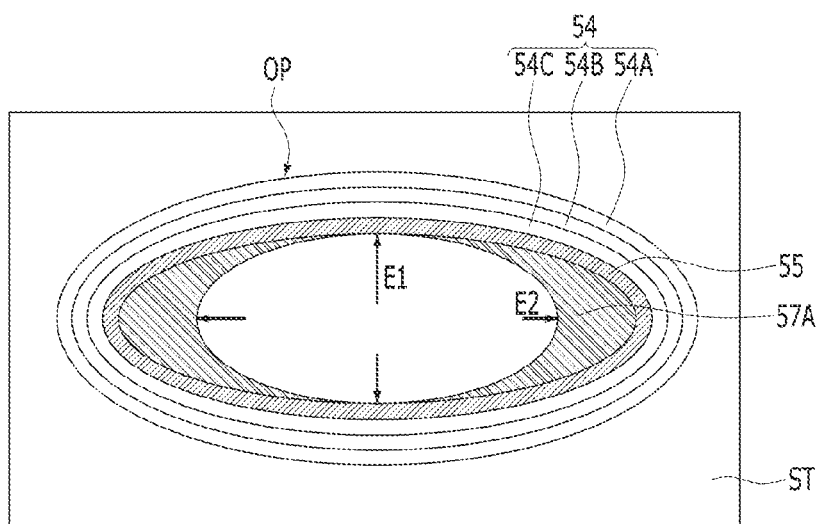
Figure 9D:
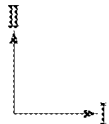

Referring to FIG. 9D, barrier patterns 57A may be formed. The barrier layer 57 may be selectively etched under the condition that the barrier layer 57 has an etching selectivity with respect to the channel layer 55. As an example, the barrier patterns 57A may be formed by wet-etching the barrier layer 57. The barrier patterns 57A may be etched by the etching chemical introduced through the opening OP. In such a case, exposed areas of the barrier layer 57 may be different according to regions, and etching amounts of the barrier layer 57 may be different. The exposed area of the barrier layer 57 on the short axis S may be wider than the exposed area of the barrier layer 57 on the long axis L, and an etching amount E1 of the barrier layer 57 at the short axis S may be larger than an etching amount E2 of the barrier layer 57 at the long axis L. Since the barrier layer 57 includes no defects D on the long axis, an increase in the etching amount on the long axis L may be prevented or reduced. Accordingly, the barrier patterns 57A covering the channel layer 55 on the long axis L and exposing the channel layer 55 on the short axis S may be formed.

Figure 9E:
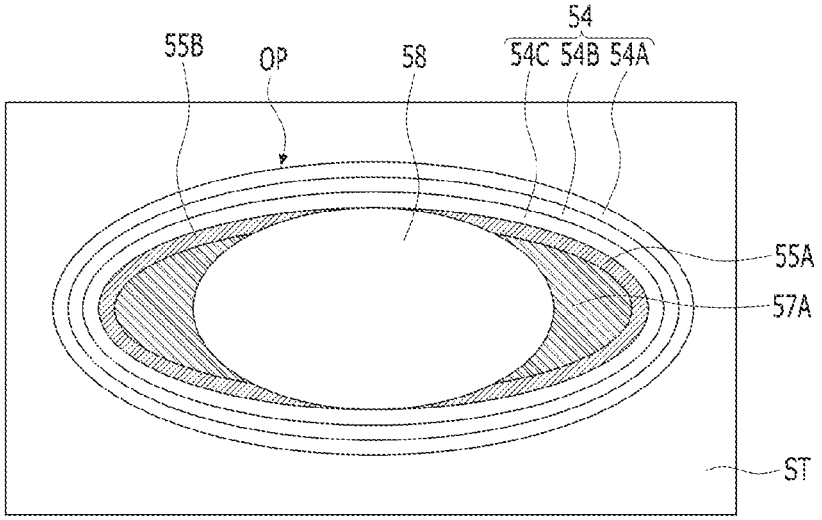
Figure 9E:
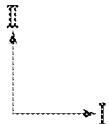

Referring to FIG. 9E, a first channel pattern 55A and a second channel pattern 55B may be formed in the opening OP. The channel layer 55 may be etched using the barrier patterns 57A as etch barriers. The channel layer 55 may be selectively etched under the condition that the channel layer 55 has an etching selectivity with respect to the barrier patterns 57A. As an example, the first channel pattern 55A and the second channel pattern 55B may be formed by wet-etching the channel layer 55. Accordingly, the first channel pattern 55A and the second channel pattern 55B located facing each other along the long axis L may be formed.

Subsequently, although not illustrated in the drawings, an insulating core including a first long axis and a first short axis may be formed between the first channel pattern 55A and the second channel pattern 55B. The insulating core may separate the first channel pattern 55A and the second channel pattern 55B from each other. Subsequently, after the insulating core is recessed to a certain depth, a capping layer including a second long axis and a second short axis may be formed. The capping layer may be connected to the first channel pattern 55A and the second channel pattern 55B.

According to the manufacturing method described above, the barrier patterns 57A may be formed using the shape of the opening OP and the physical properties of the barrier layer 57. Accordingly, the first channel pattern 55A and the second channel pattern 55B separated from each other may be formed in the opening OP.

FIG. 10A to 10F are diagrams for describing a manufacturing method of a semiconductor device in accordance with an embodiment. Hereinafter, the content overlapping with the previously described content will be omitted.

Figure 10A:
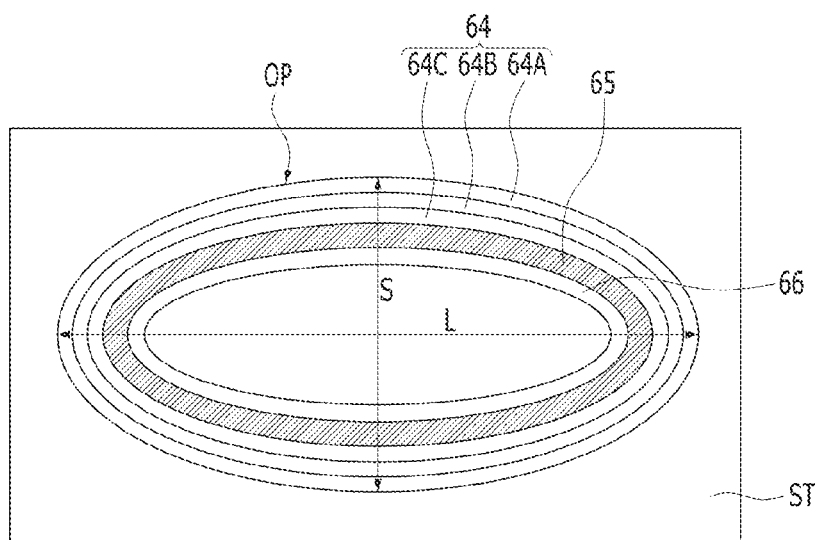
FIGS. 10A, 10B, 10C, 10D, 10E, and 10F are diagrams for describing a manufacturing method of a semiconductor device in accordance with an embodiment.
Figure 10A:
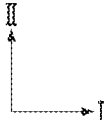

Referring to FIG. 10A, an opening OP may be formed in a stack ST. The opening OP may have an elliptical shape and may include a long axis L and a short axis S. The long axis L may be parallel to the first direction I, and the short axis S may be parallel to the second direction II intersecting the first direction I. Subsequently, a memory layer 64 may be formed in the opening OP. The memory layer 64 may include at least one of a blocking layer 64A, a data storage layer 64B, and a tunneling layer 64C, or a combination thereof. Subsequently, a channel layer 65 may be formed in the memory layer 64.

Subsequently, a first sub-barrier layer 66 may be formed in the channel layer 65. The first barrier layer sub-66 may include a material having an etching selectivity with respect to the channel layer 65. As an example, the channel layer 65 may include polysilicon, and the first sub-barrier layer 66 may include a non-conductive material. The first sub-barrier layer 66 may include an insulating material such as oxide or nitride. As an example, the first sub-barrier layer 66 may include silicon oxide ($SiO_x$), silicon oxynitride (SiON), silicon nitride ($SiN_x$), silicon carbide (SIC), silicon carbon nitride (SiCN), or the like.

The first sub-barrier layer 66 may be formed using a deposition process or an oxidation process. The first sub-barrier layer 66 may be conformally deposited along a surface of the channel layer 65. Alternatively, the first sub-barrier layer 66 may be formed by oxidizing the surface of the channel layer 65. By forming the first sub-barrier layer 66 using an oxidation process, a dangling bond on the surface of the channel layer 65 may be reduced, and a dangling bond existing at an interface between the channel layer 65 and the first sub-barrier layer 66 may be reduced.

Figure 10B:
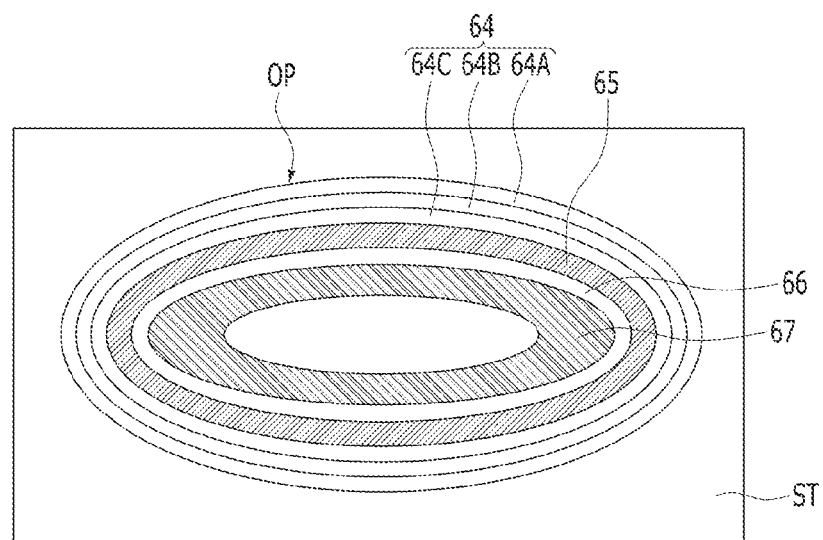
Figure 10B:
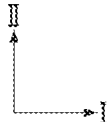

Referring to FIG. 10B, a second sub-barrier layer 67 may be formed in the first sub-barrier layer 66. The second sub-barrier layer 67 may include a material having an etching selectivity with respect to the first sub-barrier layer 66. When an etching selectivity between the second sub-barrier layer 67 and the channel layer 65 is not sufficient, the channel layer 65 and the second sub-barrier layer 67 may be separated through the first sub-barrier layer 66. As an example, the first sub-barrier layer 66 may include oxide, and the second sub-barrier layer 67 may include polysilicon, metal, or the like.

Figure 10C:
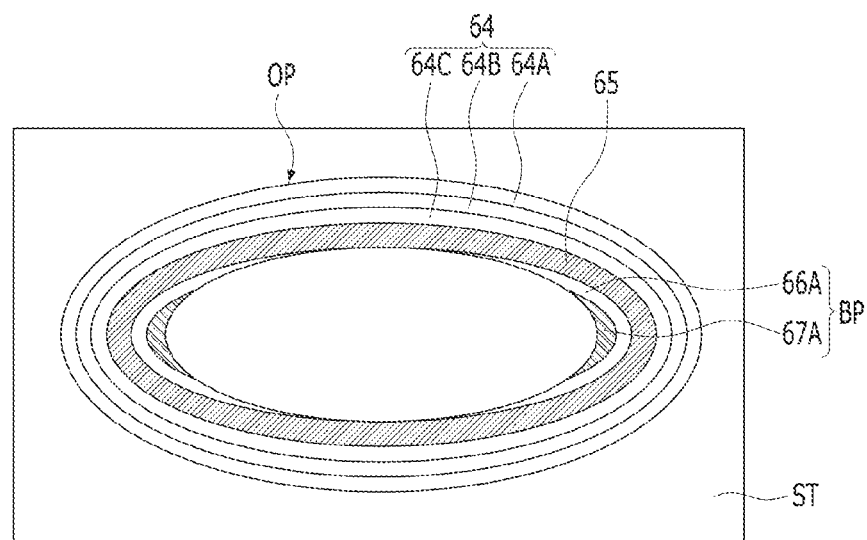
Figure 10C:
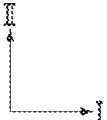

Referring to FIG. 10C, barrier patterns BP may be formed. The second sub-barrier layer 67 may be etched to form second sub-barrier patterns 67A located facing each other along the long axis L. The first sub-barrier layer 66 may be etched to form first sub-barrier patterns 66A located facing each other along the long axis L.

As an example, after the second sub-barrier patterns 67A is formed by etching the second sub-barrier layer 67, the first sub-barrier layer 66 may be etched using the second sub-barrier patterns 67A as etch barriers. The short axis of the first sub-barrier layer 66 exposed by the second sub-barrier patterns 67A may be etched, and the long axis of the first sub-barrier layer 66 covered by the second sub-barrier patterns 67A may remain to form the first barrier patterns 66A.

The first sub-barrier layer 66 may be etched using an etching chemical having an etching selectivity with respect to the second sub-barrier layer 67. As an example, when the first sub-barrier layer 66 includes oxide and the second sub-barrier layer 67 includes polysilicon, the first sub-barrier layer 66 may be etched using hydrofluoric acid-based wet etchant or dry cleaning gas having an etching selectivity with respect to polysilicon. Accordingly, the channel layer 65 may be exposed at the short axis S.

Figure 10D:
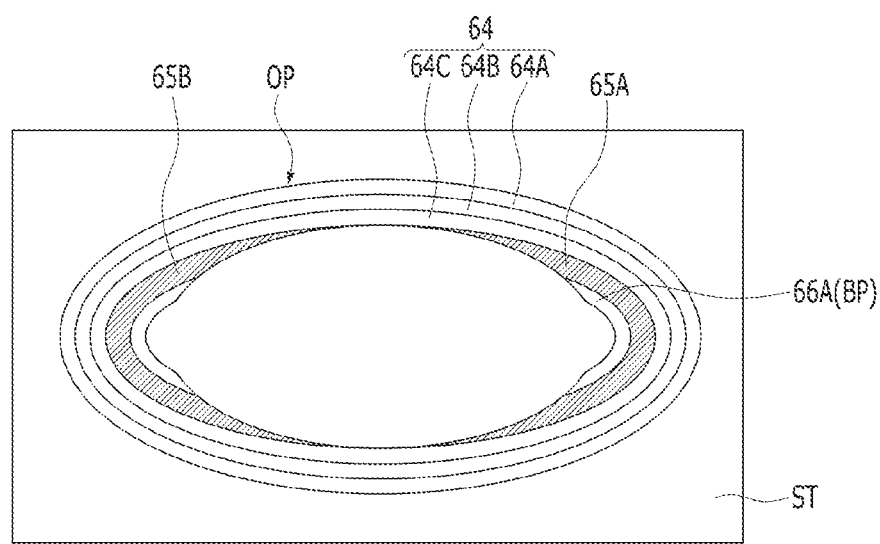
Figure 10D:
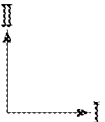

Referring to FIG. 10D, a first channel pattern 65A and a second channel pattern 65B may be formed by etching the channel layer 65 using the barrier patterns BP as etch barriers. Accordingly, the memory layer 64 may be exposed. In the process of etching the channel layer 65, at least a part of the second sub-barrier patterns 67A may be etched. Even though the second sub-barrier patterns 67A are partially etched or removed, remaining first barrier patterns 66A may be used as etch barriers.

Figure 10E:
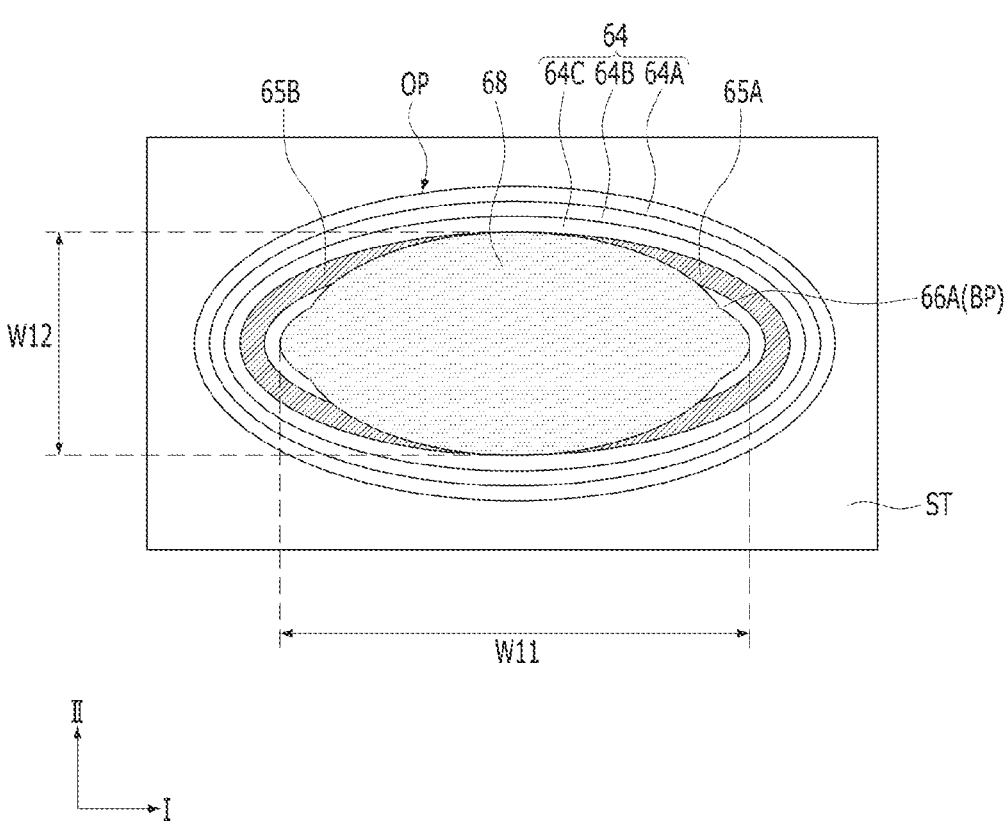

Referring to FIG. 10E, an insulating core 68 may be formed in the opening OP. The insulating core 68 may have a first width W11 in the direction of the long axis L and a second width W12 in the direction of the short axis S, and the second width W12 may be larger than the first width W11. The insulating core 68 may be located between the first channel pattern 65A and the second channel pattern 65B, and may protrude between the first channel pattern 65A and the second channel pattern 65B. The first channel pattern 65A and the second channel pattern 65B may be separated from each other by the insulating core 68.

Figure 10F:
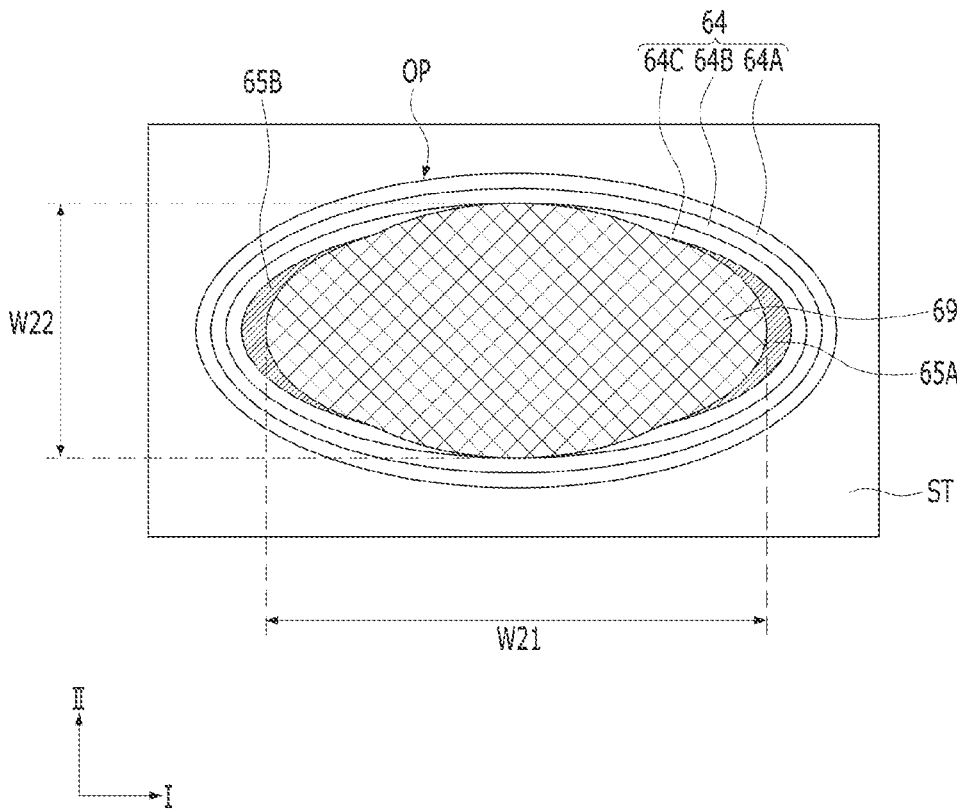

Referring to FIG. 10F, a capping layer 69 may be formed in the opening OP. The capping layer 69 may have a first width W21 in the direction of the long axis L and a second width W22 in the direction of the short axis S, and the second width W22 may be larger than the first width W21. The capping layer 69 may be located between the first channel pattern 65A and the second channel pattern 65B, and may protrude between the first channel pattern 65A and the second channel pattern 65B. The first channel pattern 65A and the second channel pattern 65B may be connected to each other by the capping layer 69.

According to an embodiment of the manufacturing method described above, the barrier pattern BP may be formed by combining the first sub-barrier pattern 66A and the second sub-barrier pattern 67A having different etching selectivities. In an embodiment, by reducing dangling bond existing on the surface of the channel layer 65 or the interface between the channel layer 65 and the first sub-barrier layer 66, it is possible to reduce leakage current and threshold voltage distribution of memory cells.

FIG. 11A to 11E are diagrams for describing a manufacturing method of a semiconductor device in accordance with an embodiment. Hereinafter, the content overlapping with the previously described content will be omitted.

Figure 11A:
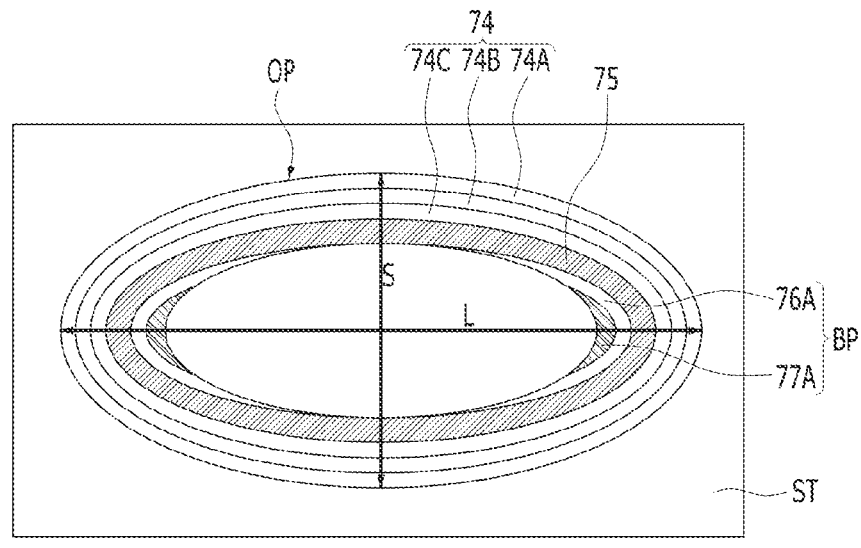
FIGS. 11A, 11B, 11C, 11D, and 11E are diagrams for describing a manufacturing method of a semiconductor device in accordance with an embodiment.
Figure 11A:
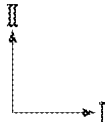

Referring to FIG. 11A, an opening OP may be formed in a stack ST. The opening OP may have an elliptical shape and may include a long axis L and a short axis S. The long axis L may be parallel to the first direction I, and the short axis S may be parallel to the second direction II intersecting the first direction I. Subsequently, a memory layer 74 may be formed in the opening OP. The memory layer 74 may include at least one of a blocking layer 74A, a data storage layer 74B, and a tunneling layer 74C, or a combination thereof. Subsequently, barrier patterns BP may be formed in the memory layer 74. The barrier pattern BP may include a first sub-barrier pattern 76A and a second sub-barrier pattern 77A.

Figure 11B:
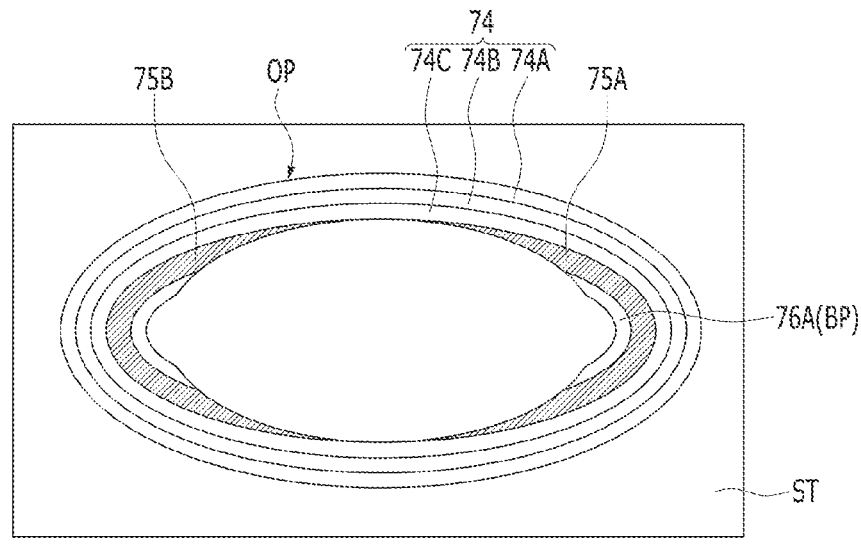
Figure 11B:
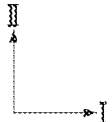

Referring to FIG. 11B, a first channel pattern 75A and a second channel pattern 75B may be formed by etching the channel layer 75 using the barrier patterns BP as etch barriers. Accordingly, the memory layer 74 may be exposed. At the short axis S, the memory layer 74 may be exposed between the first channel pattern 75A and the second channel pattern 75B. When the channel layer 75 is etched, the second sub-barrier pattern 77A may be etched and the first sub-barrier pattern 76A may be exposed.

Figure 11C:
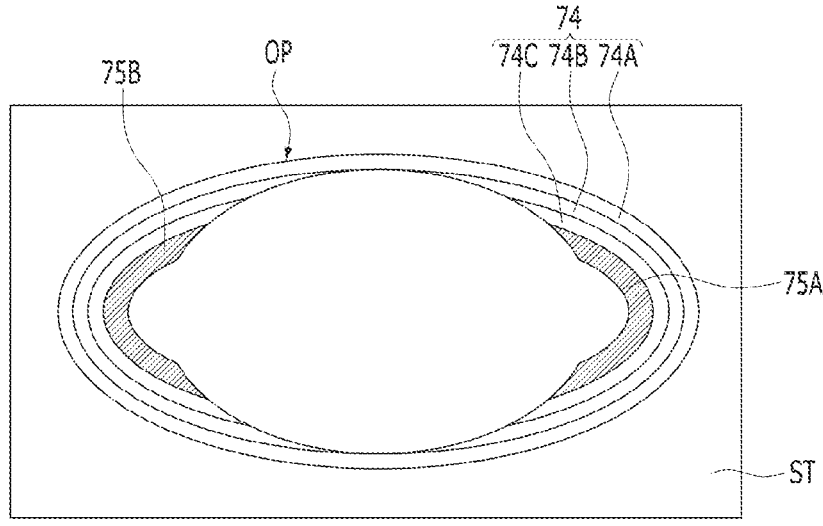
Figure 11C:
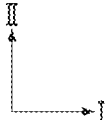

Referring to FIG. 11C, at least a part of the memory layer 74 may be etched. As an example, the data storage layer 74B may be exposed by etching the tunneling layer 74C exposed between the first channel pattern 75A and the second channel pattern 75B. The blocking layer 74A may be exposed by etching the tunneling layer 74C and the data storage layer 74B exposed between the first channel pattern 75A and the second channel pattern 75B. During the etching process, the first channel pattern 75A and the second channel pattern 75B may be used as etch barriers.

In the process of etching the memory layer 74, at least a part of the barrier patterns BP may be etched. As an example, at least a part of the first sub-barrier patterns 76A may be etched or removed. Accordingly, the first channel pattern 75A and the second channel pattern 75B may be exposed.

Figure 11D:
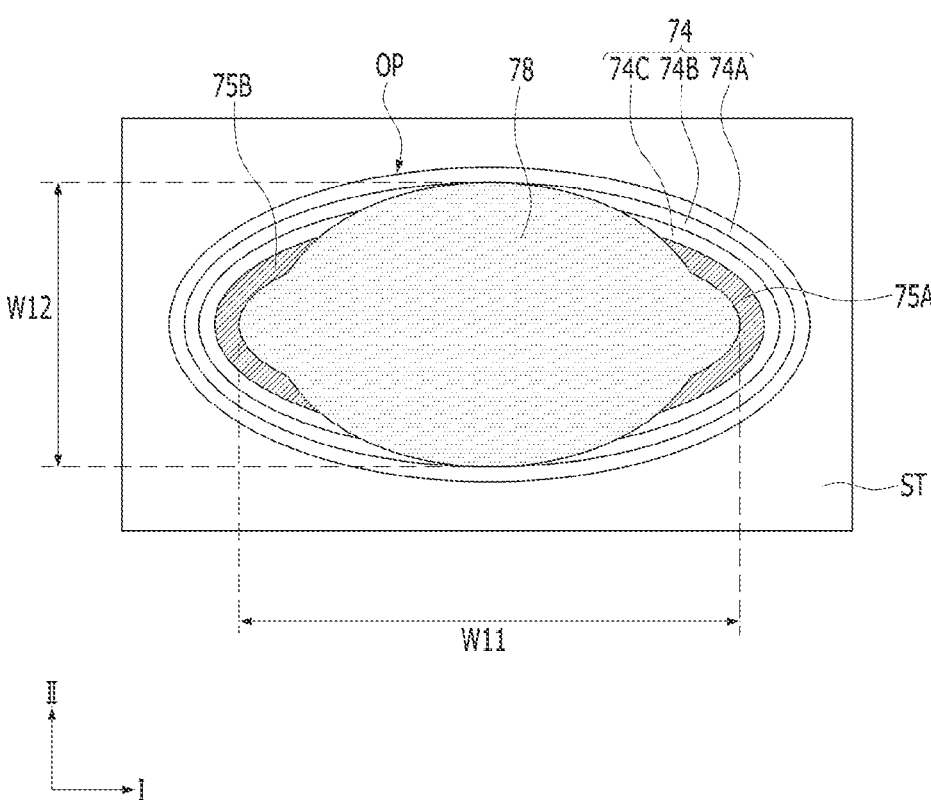

Referring to FIG. 11D, an insulating core 78 may be formed in the opening OP. The insulating core 78 may have a first width W11 in the direction of the long axis L and a second width W12 in the direction of the short axis S, and the second width W12 may be larger than to the first width W11. The insulating core 78 may be located between the first channel pattern 75A and the second channel pattern 75B and protrude into the memory layer 74. The insulating core 78 may extend to the data storage layer 74B by passing through the tunneling layer 74C. The insulating core 78 may extend to the blocking layer 74A by passing through the tunneling layer 74C and the data storage layer 74B.

Figure 11E:
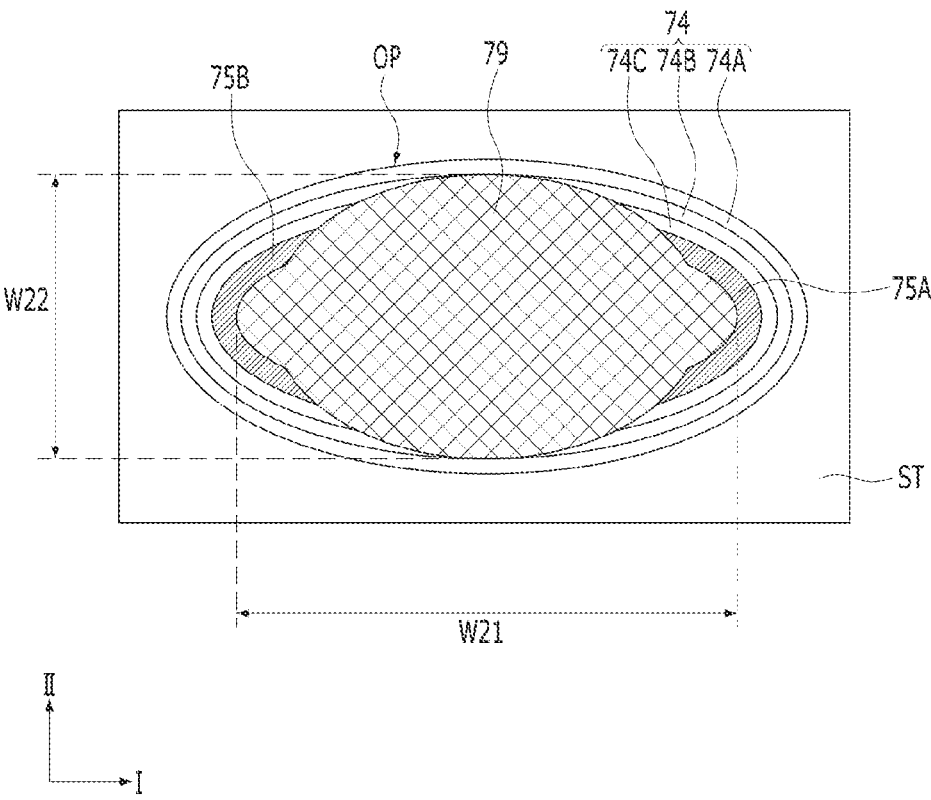

Referring to FIG. 11E, a capping layer 79 may be formed in the opening OP. The capping layer 79 may have a first width W21 in the direction of the long axis L and a second width W22 in the direction of the short axis S, and the second width W22 may be larger than the first width W21. The capping layer 79 may be located between the first channel pattern 75A and the second channel pattern 75B and may protrude into the memory layer 74. The capping layer 79 may extend to the data storage layer 74B by passing through the tunneling layer 74C. The capping layer 79 may extend to the blocking layer 74A by passing through the tunneling layer 74C and the data storage layer 74B.

According to the manufacturing method described above, the tunneling layer 74C surrounding the first channel pattern 75A and the tunneling layer 74C surrounding the second channel pattern 75B may be separated from each other. The data storage layer 74B surrounding the first channel pattern 75A and the data storage layer 74B surrounding the second channel pattern 75B may be separated from each other. Accordingly, the data storage layer 74B of a first memory cell including the first channel pattern 75A and the data storage layer 74B of a second memory cell including the second channel pattern 75B may be separated from each other, and the retention characteristics of the semiconductor device may be improved.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A semiconductor device comprising:
   a gate structure including stacked gate lines;
   an insulating core located in the gate structure and including a first long axis and a first short axis;
   a memory layer surrounding the insulating core;
   a first channel pattern and a second channel pattern located facing each other along the first long axis, wherein the first channel pattern and the second channel pattern are located between the insulating core and the memory layer; and
   a capping layer including a second short axis and a second long axis, the capping layer located between the first channel pattern and the second channel pattern and protruding beyond both the first channel pattern and the second channel pattern along the second short axis.

2. The semiconductor device of claim 1, wherein the insulating core comprises:
   a first body including the first long axis and the first short axis and protruding beyond both the first channel pattern and the second channel pattern along the first short axis;
   a first protrusion protruding from the first body toward the first channel pattern; and
   a second protrusion protruding from the first body toward the second channel pattern.

3. The semiconductor device of claim 1, wherein the capping layer comprises:
   a second body extending along the second long axis and the second short axis;
   a first protruding pattern protruding from the second body toward the first channel pattern; and
   a second protruding pattern protruding from the second body toward the second channel pattern.

4. The semiconductor device of claim 3, wherein the second body protrudes beyond both the first channel pattern and the second channel pattern and into the memory layer.

5. The semiconductor device of claim 3, wherein the memory layer includes a tunneling layer, a data storage layer, and a blocking layer, and the second body extends beyond both the first channel pattern and the second channel pattern and to the data storage layer through the tunneling layer.

6. The semiconductor device of claim 3, wherein the memory layer includes a tunneling layer, a data storage layer, and a blocking layer, and the second body extends beyond both the first channel pattern and the second channel pattern and to the blocking layer through the tunneling layer and the data storage layer.

7. The semiconductor device of claim 3, wherein at least one of the first channel pattern and the second channel pattern includes a tip partially surrounding the second body.

8. The semiconductor device of claim 7, wherein the tip extends along a curved surface of the second body.

9. The semiconductor device of claim 1, further comprising:
    a bit line connected to the first channel pattern and the second channel pattern through the capping layer.

10. The semiconductor device of claim 9, wherein the gate lines comprise:
    a first drain select line configured to control a connection between the first channel pattern and the bit line; and
    a second drain select line configured to control a connection between the second channel pattern and the bit line.

11. The semiconductor device of claim 1, further comprising:
    a first barrier pattern located between the first channel pattern and the insulating core; and
    a second barrier pattern located between the second channel pattern and the insulating core.

12. The semiconductor device of claim 11, wherein the first barrier pattern and the second barrier pattern are separated from each other and are located facing each other along the first long axis.

13. The semiconductor device of claim 11, wherein the first barrier pattern includes oxide.

14. A semiconductor device comprising:
    a first memory string including a first channel pattern;

a second memory string adjacent to the first memory string in a first direction and including a second channel pattern;
    an insulating core located between the first channel pattern and the second channel pattern, and having a first width in the first direction and a second width in a second direction intersecting the first direction, the first width being larger than the second width;
    a bit line connected to the first memory string and the second memory string;
    a first drain select line configured to control a connection between the first memory string and the bit line; and
    a second drain select line configured to control a connection between the second memory string and the bit line.

15. The semiconductor device of claim 14, wherein the insulating core protrudes beyond both the first channel pattern and the second channel pattern in the second direction, and separates the first channel pattern and the second channel pattern from each other.

16. The semiconductor device of claim 14, further comprising:
    a capping layer including a body located between the first channel pattern and the second channel pattern, a first protruding pattern protruding from the body toward the first channel pattern, and a second protruding pattern protruding from the body toward the second channel pattern, the capping layer being connected to the first channel pattern and the second channel pattern.

17. The semiconductor device of claim 16, wherein the body of the capping layer includes a long axis and a short axis, and the first protruding pattern and the second protruding pattern are located facing each other along the long axis.

* * * * *